US012677529B2

(12) United States Patent
Kim et al.

(10) Patent No.: US 12,677,529 B2
(45) Date of Patent: Jul. 7, 2026

(54) ORGANIC LIGHT EMITTING DEVICE

(71) Applicant: LG Display Co., Ltd., Seoul (KR)

(72) Inventors: Chun-Ki Kim, Paju-si (KR); Jeong-Eun Won, Paju-si (KR); Seung-Ryong Joung, Paju-si (KR); Yo-Sub Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 399 days.

(21) Appl. No.: 18/527,783

(22) Filed: Dec. 4, 2023

(65) Prior Publication Data

US 2024/0276754 A1 Aug. 15, 2024

(30) Foreign Application Priority Data

Jan. 26, 2023 (KR) ........................ 10-2023-0010297

(51) Int. Cl.

| | |
|---|---|
| ***H10K 50/15*** | (2023.01) |
| ***H10K 50/155*** | (2023.01) |
| ***H10K 50/16*** | (2023.01) |
| ***H10K 85/60*** | (2023.01) |

(52) U.S. Cl.

CPC ......... *H10K 50/157* (2023.02); *H10K 50/156* (2023.02); *H10K 85/60* (2023.02); *H10K 85/624* (2023.02); *H10K 85/633* (2023.02); *H10K 85/654* (2023.02); *H10K 85/6572* (2023.02);

(Continued)

(58) Field of Classification Search

CPC .... H10K 50/157; H10K 50/156; H10K 85/60; H10K 85/624; H10K 85/633; H10K 85/654; H10K 85/6572; H10K 50/155; H10K 50/166; H10K 85/626; H10K 2102/351; H10K 50/00; H10K 50/19; H10K 50/131; H10K 50/15; H10K 59/12; H10K 59/38; H10K 50/13; H10K 50/16; H10K 59/32; H10K 85/631

See application file for complete search history.

(56) References Cited

U.S. PATENT DOCUMENTS

| | | | | |
|---|---|---|---|---|
| 12,538,642 B2 * | 1/2026 | Lee | ........................ | H10K 50/19 |
| 2020/0295290 A1 * | 9/2020 | Tsujimura | ............ | H10K 50/165 |
| 2023/0413666 A1 * | 12/2023 | Gao | ..................... | H10K 85/622 |

FOREIGN PATENT DOCUMENTS

KR 10-2013-0096531 A 8/2013

* cited by examiner

*Primary Examiner* — Britt Hanley
*Assistant Examiner* — William C. Trice, III
(74) *Attorney, Agent, or Firm* — Birch, Stewart, Kolasch & Birch, LLP

(57) ABSTRACT

An organic light emitting device (e.g., a display device or a lighting device) is described, which includes a substrate; and an OLED over the substrate, the organic light emitting diode comprising: a cathode; an anode over the cathode; and an organic light emitting layer including a first emitting part, a second emitting part between the first emitting part and the anode and a third emitting part between the first and second emitting parts. The first emitting part includes a first EML, a p-doping layer between the cathode and the first EML, an n-doping layer between the first EML and the p-doping layer and a first ETL between the first EML and the n-doping layer. The second emitting part includes a second EML, and the third emitting part includes a third EML. The p-doping layer includes an HTL and first and second p-doping layers at both sides of the HTL, respectively.

20 Claims, 7 Drawing Sheets

(52) U.S. Cl.
CPC ......... *H10K 50/155* (2023.02); *H10K 50/166* (2023.02); *H10K 85/626* (2023.02)

ORGANIC LIGHT EMITTING DEVICE

CROSS-REFERENCE TO RELATED APPLICATIONS

The present application claims priority to Korean Patent Application No. 10-2023-0010297 filed in the Republic of Korea on Jan. 26, 2023, which is hereby incorporated by reference in its entirety into the present application.

BACKGROUND

Technical Field

The present disclosure relates to an organic light emitting device, and more particularly, to an organic light emitting device having advantages in driving voltage, emitting efficiency and lifespan.

Discussion of the Related Art

As display devices have become larger, there exists a desire to have flat panel display devices that are thinner, and/or take up less space. Among the flat panel display devices, organic light emitting devices that include an organic light emitting diode (OLED) are rapidly being developed. An OLED can be formed on a flexible transparent substrate, e.g., a plastic substrate, and can be driven by low voltage. In addition, the OLED has low power consumption and high color sense.

The OLED includes a cathode as an electron injection electrode, an anode as a hole injection electrode and an emitting material layer therebetween. Electrons from the cathode and holes from the anode are combined in the emitting material layer, to generate an exciton, where the exciton is transformed from an excited state to a ground state. As a result, the light is emitted from the OLED.

The organic light emitting device includes an OLED including an anode, a cathode, and an organic light emitting layer between the anode and the cathode. The organic light emitting device can require at least three thin film transistors and at least one storage capacitor for driving the OLED. For instance, a normal organic light emitting device, where the anode, the organic light emitting layer and the cathode are sequentially stacked on a substrate, has a 3T1C structure so that an aperture ratio of the organic light emitting device is decreased. There remains a need in the art to provide an organic light emitting device with a higher aperture ratio, as well as improved driving voltage, emitting efficiency and lifespan.

SUMMARY OF THE DISCLOSURE

Embodiments of the present disclosure are directed to an organic light emitting device that address one or more of the problems and disadvantages of the related art.

An object of the present disclosure is to provide an organic light emitting device having a high aperture ratio. In certain embodiments, the aperture ratio of a pixel may be defined as the ratio of the light-sensitive area of a pixel to the total area of that pixel. The aperture ratio may be expressed as a percentage, e.g., the higher the aperture ratio, the more light is emitted in a given display area. In a preferred embodiment, the aperture ratio may be 50% or more, preferably 60% or more, preferably 70% or more, preferably 80% or more, or preferably 90% or more.

An object of the present disclosure is to provide an organic light emitting device having improved driving voltage, emitting efficiency and lifespan. Further, the present disclosure provides a display device comprising a display panel configured to display an image, where the display panel includes a plurality of pixels disposed on a substrate, and each of the plurality of pixels includes the organic light emitting device.

Additional features and aspects will be set forth in the description that follows, and in part will be apparent from the description, or can be learned by practice of the present disclosure concepts provided herein. Other features and aspects of the present disclosure concepts can be realized and attained by the structure particularly pointed out in the written description, or derivable therefrom, and the claims hereof as well as the appended drawings.

As described herein, an aspect of the present disclosure is an organic light emitting device comprising a substrate; and an organic light emitting diode over the substrate, the organic light emitting diode comprising: a cathode over the substrate; an anode over the cathode; and an organic light emitting layer that is positioned between the cathode and the anode. The organic light emitting layer includes a first emitting part, a second emitting part between the first emitting part and the anode and a third emitting part between the first and second emitting parts. The first emitting part includes a first emitting material layer, a p-doping layer between the cathode and the first emitting material layer, an n-doping layer between the first emitting material layer and the p-doping layer and a first electron transporting layer between the first emitting material layer and the n-doping layer. The second emitting part includes a second emitting material layer, and the third emitting part includes a third emitting material layer. The p-doping layer includes a hole transporting material layer and first and second p-doping layers at both sides of the hole transporting material layer, respectively.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain principles of the present disclosure.

DETAILED DESCRIPTION OF THE EMBODIMENTS

Figure 1:
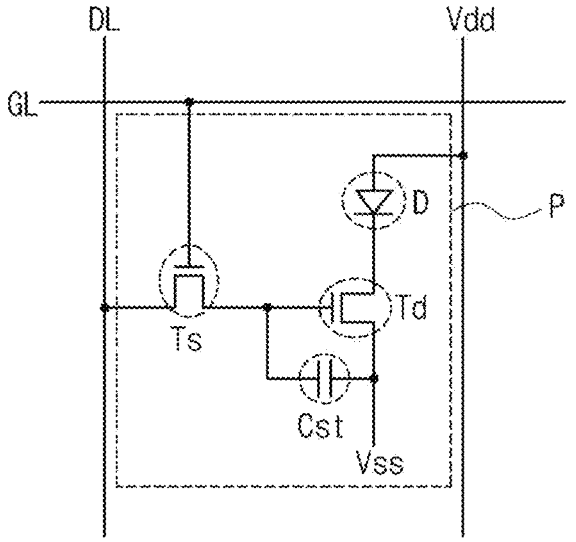
FIG. 1 is a schematic circuit diagram of an organic light emitting display device according to one or more embodiments of the present disclosure.

Reference will now be made in detail to aspects of the present disclosure, examples of which can be illustrated in the accompanying drawings. All the components of each OLED and each organic light emitting display device according to all embodiments of the present disclosure are operatively coupled and configured. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations are selected only for convenience of writing the specification and can be thus different from those used in actual products.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscure the subject matter of the present disclosure, the detailed description thereof can be omitted. When terms such as “including,” “having,” “comprising,” etc. are used in this specification, other parts can be added unless “only” is used. When a component is expressed in the singular, cases including the plural are included unless a specific statement is described.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts can be disposed between the two parts unless a more limiting term, such as “just” or “direct(ly)” is used.

In describing a time relationship, for example, when the temporal order is described as, for example, “after,” “subsequent,” “next,” and “before,” a case that is not continuous can be included unless a more limiting term, such as “just,” “immediate(ly),” or “direct(ly)” is used.

It will be understood that, although the terms “first,” “second,” etc. can be used herein to describe various elements, these elements should not be limited by these terms. These terms are only used to distinguish one element from another and may not define order or sequence. For example, a first element could be termed a second element, and, similarly, a second element could be termed a first element, without departing from the scope of the present disclosure.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in co-dependent relationship.

In the present disclosure, an organic light emitting device can be an organic light emitting display device or an organic lightening device. As an example, an organic light emitting display device, which is a display device including the OLED of the present disclosure, will be mainly described.

Reference will now be made in detail to some of the examples and preferred embodiments, which are illustrated in the accompanying drawings.

FIG. 1 is a schematic circuit diagram of an organic light emitting display device according to one or more embodiments of the present disclosure.

As shown in FIG. 1, an organic light emitting display device includes a gate line GL and a data line DL crossing each other to define a pixel region P. The organic light emitting display device further includes a high potential voltage line Vdd and a low potential voltage line Vss. In the pixel region P, a switching thin film transistor TFT Ts, a driving TFT Td, a storage capacitor Cst and an OLED D are disposed. The pixel region P can include a red pixel region, a green pixel region and a blue pixel region. The organic light emitting display device includes a plurality of such pixel regions P.

The switching TFT Ts is connected to the gate line GL and the data line DL, and the driving TFT Td is connected to the switching TFT Ts and the low potential voltage line Vss. The storage capacitor Cst is connected to a gate electrode of the driving TFT Td and the low potential voltage line Vss, and the OLED D is connected to the driving TFT Td and the high potential voltage line Vdd.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current flows from the high potential voltage line Vdd to the low potential voltage line Vss so that the OLED D can emit light.

The storage capacitor Cst serves to maintain the voltage of the gate electrode of the driving TFT Td when the switching TFT Ts is turned off.

As a result, the organic light emitting display device displays a desired image.

The OLED D has an inverted-structure, where a cathode, an organic light emitting layer and an anode are sequentially stacked over a substrate, and can be driven by two TFTs and one storage capacitor. In other words, the organic light emitting display device has a 2T1C structure so that an aperture ratio of the organic light emitting display device is improved.

Figure 2:
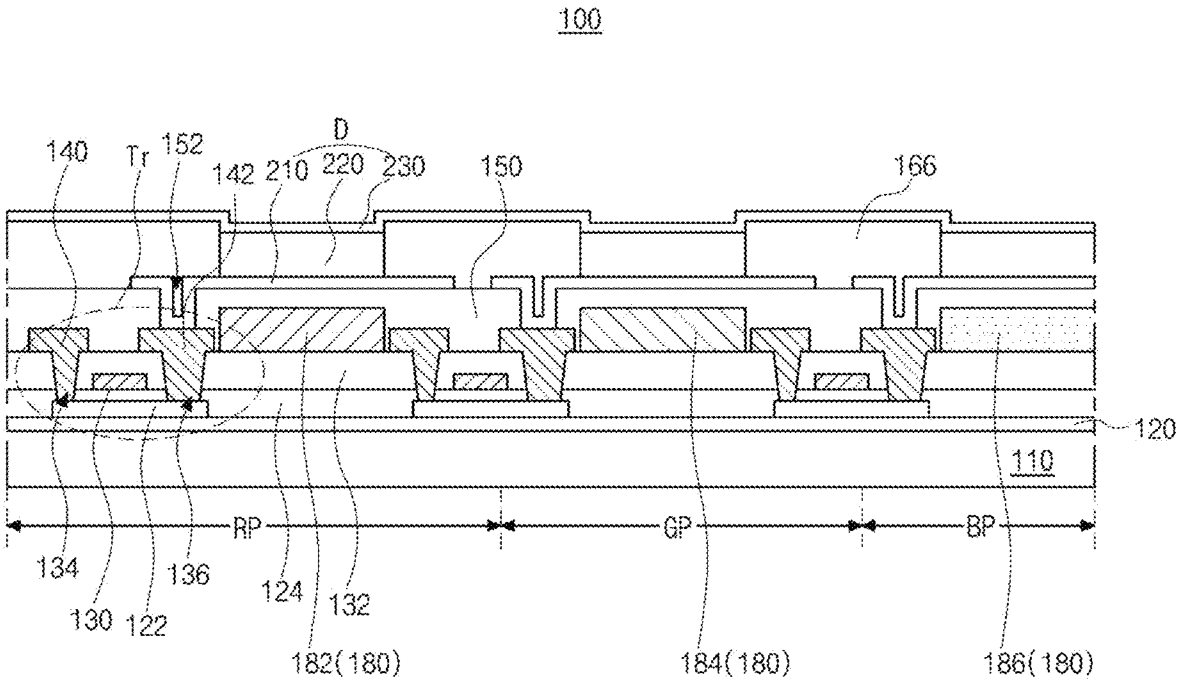
FIG. 2 is a schematic cross-sectional view of an organic light emitting display device according to an embodiment of the present disclosure.

FIG. 2 is a schematic cross-sectional view of an organic light emitting display device according to an embodiment of the present disclosure.

As shown in FIG. 2, the organic light emitting display device 100 includes a substrate 110, where a red pixel region RP, a green pixel region GP and a blue pixel region BP are defined, a TFT Tr over the substrate 110, an OLED D, which is positioned over and connected to the TFT Tr, and a color filter layer 180 between the OLED D and the substrate 110. The organic light emitting display device 100 includes a plurality of pixels including a plurality of red pixels RP, a plurality of green pixels GP and a plurality of blue pixels BP, and the plurality of pixels can be disposed in a matrix configuration or other suitable configurations. The plurality of pixels are part of a display panel included in the organic light emitting display device 100.

The substrate 110 can be a glass substrate or a flexible substrate. For example, the substrate 110 can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 120 is formed on the substrate 110, and the TFT Tr corresponding to each of the red, green and blue pixel regions RP, GP and BP is formed on the buffer layer 120. The buffer layer 120 can be omitted in certain embodiments, and the TFT Tr can be formed on the substrate 110.

A semiconductor layer 122 is formed on the buffer layer 120. The semiconductor layer 122 can include an oxide semiconductor material or polycrystalline silicon. When the semiconductor layer 122 includes the oxide semiconductor material, a light-shielding pattern can be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities can be doped into both sides of the semiconductor layer 122.

A gate insulating layer 124 of an insulating material is formed on the semiconductor layer 122. The gate insulating layer 124 can be formed of an inorganic insulating material such as silicon oxide (SiOx) or silicon nitride (SiNx).

A gate electrode 130, which is formed of a conductive material, e.g., metal, is formed on the gate insulating layer 124 to correspond to a center of the semiconductor layer 122. In FIG. 2, the gate insulating layer 124 is formed on an entire surface of the substrate 110. Alternatively, the gate insulating layer 124 can be patterned to have the same shape as the gate electrode 130.

An interlayer insulating layer 132, which is formed of an insulating material, is formed on the gate electrode 130. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130. The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr, and the TFT Tr can be an n-type TFT. The TFT Tr serves as a driving element. Namely, the TFT Tr can correspond to the driving TFT Td (of FIG. 1).

In FIG. 2, the gate electrode 130, the source electrode 140, and the drain electrode 142 are positioned over the semiconductor layer 122. Namely, the TFT Tr has a coplanar structure. Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

The color filter layer 180 is formed on the interlayer insulating layer 132. The color filter layer 180 includes red, green and blue color filters 182, 184 and 186 respectively corresponding to the red, green and blue pixel regions RP, GP and BP.

The red color filter 182 can include at least one of a red dye and a red pigment, the green color filter 184 can include at least one of a green dye and a green pigment, and the blue color filter 186 can include at least one of a blue dye and a blue pigment.

In some embodiments, the gate line and the data line cross each other to define the pixel region, and the switching TFT is formed to be connected to the gate and data lines. The switching TFT is connected to the TFT Tr as the driving element. In addition, the high potential voltage line and the low potential voltage line are formed over the substrate 110, and the storage capacitor for maintaining the voltage of the gate electrode of the TFT Tr in one frame can be further formed.

A planarization layer 150 is formed on the color filter layer 180 and the TFT Tr and over an entire surface of the substrate 110. The planarization layer 150 has a flat top surface and includes a drain contact hole 152 exposing the drain electrode 142 of the TFT Tr.

The OLED D is positioned on the planarization layer 150 and includes a cathode 210, which is connected to the drain electrode 142 of the TFT Tr through the drain contact hole 152, an organic light emitting layer 220 on the cathode and an anode 230 on the organic light emitting layer 220. The OLED D is positioned in each of the red, green and blue pixel regions RP, GP and BP and emits white light.

The cathode 210 is separately formed in each of the red, green and blue pixel regions RP, GP and BP and on the planarization layer 150. The cathode 210 can be formed of a transparent conductive oxide (TCO) having a relatively high work function. The cathode 210 can be a transparent electrode. For example, the cathode 210 can be formed of indium-tin-oxide (ITO), indium-zinc-oxide (IZO) or indium-tin-zinc-oxide (ITZO).

A bank layer 166 is formed on the planarization layer 150 to cover an edge of the cathode 210. Namely, the bank layer 166 is positioned at a boundary of the pixel and exposes a center of the cathode 210 in the pixel. Since the OLED D emits white light in each of the red, green and blue pixel regions RP, GP and BP, the organic light emitting layer 220 can be formed as a common layer without separation. The bank layer 166 can be formed to prevent current leakage at an edge of the cathode 210. The bank layer 166 can be omitted in certain embodiments.

An organic light emitting layer 220 is formed on the cathode 210. The organic light emitting layer 220 includes a first emitting part positioned on the cathode 210 and including a first emitting material layer (EML), a second emitting part positioned between the first emitting part and the anode 230 and including a second EML and a third emitting part positioned between the first and second emitting parts and including a third EML. The organic light emitting layer 220 can further include a first charge generation layer (CGL) between the first and third emitting parts and a second CGL between the second and third emitting parts.

Each of the first and second EMLs can be a blue EML, and the third EML can include a red EML and a green EML. In addition, the third EML can further include a yellow-green EML.

The anode 230 is formed over the substrate 110 where the organic light emitting layer 220 is formed. The anode 230 is disposed over an entire surface of a display area and can include a metallic material having high reflectance. The anode 230 can be a reflective electrode. For example, the anode 230 can include a material selected from the group consisting of aluminum (Al), magnesium (Mg), calcium (Ca), silver (Ag), their alloy and their combination.

Namely, the OLED D can be an inverted-structure white OLED, but other variation is possible.

An encapsulation layer (or an encapsulation film) can be formed to prevent penetration of moisture into the OLED D. For example, the encapsulation film can include a first inorganic insulating layer, an organic insulating layer and a second inorganic insulating layer sequentially stacked, but it is not limited thereto.

In addition, a metal plate can be disposed on the encapsulation layer.

Moreover, a polarization plate for reducing an ambient light reflection can be disposed at an outer side of the substrate 110. For example, the polarization plate can be a circular polarization plate.

In FIG. 2, the color filter layer 180 is positioned between the OLED D and the interlayer insulating layer 132. Alternatively, a position of the color filter layer 180 can be adjusted between the OLED D and the substrate 110.

A color conversion layer can be formed between the OLED D and the color filter layer 180. The color conversion layer can include a red color conversion layer, a green color conversion layer and a blue color conversion layer respectively corresponding to the red, green and blue pixel regions RP, GP and BP. The white light from the OLED D is converted into the red light, the green light and the blue light by the red, green and blue color conversion layer, respectively.

As described above, the white light from the OLED D passes through the red, green and blue color filters 182, 184 and 186 respectively corresponding to the red, green and blue pixel regions RP, GP and BP so that the red, green and blue light can be displayed in the red, green and blue pixel regions RP, GP and BP, respectively.

In FIG. 2, the OLED D emitting the white light is used for a display device. Alternatively, the OLED D can be formed on an entire surface of a substrate without at least one of the driving element and the color filter layer to be used for a lightening device. The display device and the lightening device each including the OLED D of the present disclosure can be referred to as an organic light emitting device.

Figure 3:
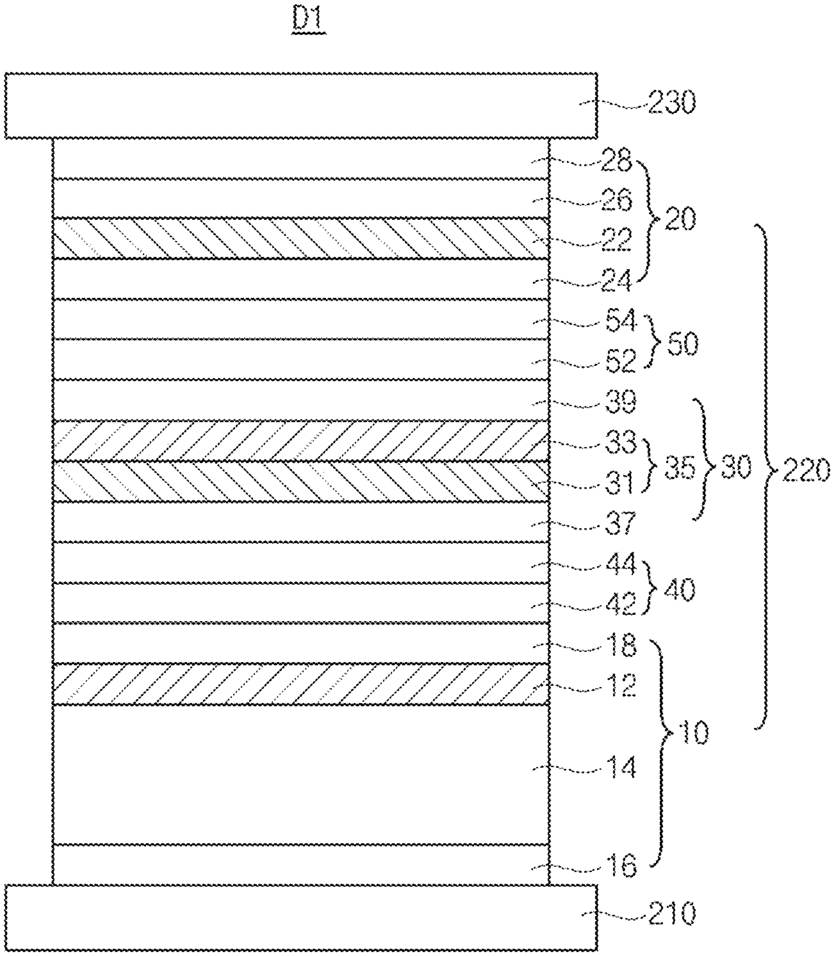
FIG. 3 is a schematic cross-sectional view of an OLED according to an embodiment of the present disclosure.

FIG. 3 is a schematic cross-sectional view of an OLED according to an embodiment of the present disclosure.

As shown in FIG. 3, the OLED D1 includes the cathode 210 connected to the driving TFT, the anode 230 facing the cathode 210 and an organic light emitting layer 220 between the cathode 210 and the anode 230, and the organic light emitting layer 220 includes a first emitting part 10 including a first EML 12, a first electron transporting layer (ETL) 14, an n-doping layer 16 and a first hole transporting layer (HTL) 18, a second emitting part 20 including a second EML 22, a second ETL 24, a second HTL 26 and a hole injection layer (HIL) 28 and a third emitting part 30 including a third EML 35, a third ETL 37 and a third HTL 39.

In addition, the organic light emitting layer 220 can further include a first CGL 40 between the first and third emitting parts 10 and 30 and a second CGL 50 between the second and third emitting parts 20 and 30.

In the first emitting part 10, the first ETL 14 is positioned between the first EML 12 and the n-doping layer 16, and the first HTL 18 is positioned on the first EML 12.

The first emitting part can further include an electron blocking layer (EBL) between the first EML 12 and the first HTL 18.

Each of the first and second EMLs 12 and 22 can be a blue EML, and the third EML 35 can include a red EML and a green EML.

Namely, the OLED D1 is an inverted-structure 3-stack white OLED.

In the OLED D1, the first EML 12 being the blue EML has a pre-determined distance from the cathode 210 being the transparent electrode to improve the emitting efficiency of the OLED D1. According to an aspect of the invention, the first EML 12 may have a distance of 800 to 1600 Å, for example, 900, 1000, 1050, or 1100 to 1150, 1200, 1300, 1400, or 1500 Å, from the cathode 210. According to an aspect of the invention, the first ETL 14 may have a thickness of 600 to 1400 Å, for example, 700, 800, or 900 to 1000, 1100, 1200, or 1300 Å, so as to achieve the pre-determined distance of the first ETL 14 from the cathode 210.

For example, when the first ETL 14 has a thickness of 800 to 1000 Å, the first EML 12 can have a distance of 1000 to 1200 Å from the cathode 210.

Namely, the OLED D1 has an inverted-structure so that the aperture ratio of the organic light emitting display device 100 is improved, and the first ETL 14 has a relatively large thickness so that the emitting efficiency of the organic light emitting display device 100 is improved.

[OLED1]

A cathode (ITO), an n-doping layer (150 Å), a first ETL, a first blue EML, an EBL, a first HTL, a first p-type CGL, a first n-type CGL, a third ETL, a red EML, a green EML, a third HTL, a second p-type CGL, a second n-type CGL, a second ETL, a second blue EML, a second HTL, an HIL, and an anode (A1) were sequentially stacked on a substrate to form an inverted-structure 3-stack white OLED.

(1) COMPARATIVE EXAMPLE 1

The first ETL was formed with a thickness of 500 Å.

(2) EXAMPLE 1

The first ETL was formed with a thickness of 900 Å.

The emission properties, e.g., an efficiency (cd/A), a blue index (BI), a color coordinate index (CIE(x, y)), a brightness (nit), of the OLED of Comparative Example 1 and Example 1 were measured and listed in Table 1. In Table 1, the color coordinate index of Comparative Example 1 is a relative value to the color coordinate index of Example 1.

TABLE 1

| | cd/A | | | | CIE(x, y) | | | nit |
|---|---|---|---|---|---|---|---|---|
| | R | G | B | BI | R | G | B | W |
| Ref1 | 95% | 106% | 94% | 87% | +0.001, 0.000 | −0.014, 0.009 | 0.000, +0.005 | 67% |
| Ex1 | 100% | 100% | 100% | 100% | — | — | — | 100% |

As shown in Table 1 above, the emitting efficiency significantly depends on a distance between the first blue EML and the cathode according to a thickness of the first ETL.

Namely, in comparison to the OLED of Comparative Example 1, where the first ETL has a thickness of 500 Å so that the first blue EML has a distance of 650 Å from the cathode, the emitting efficiency of the OLED of Example 1, where the first ETL has a thickness of 900 Å so that the first blue EML has a distance of 1050 Å from the cathode, is significantly improved.

However, when the first ETL 14 has a relatively large thickness, a driving voltage of the organic light emitting display device is significantly increased. Namely, since an electron mobility of an electron transporting material is smaller than a hole mobility of a hole transporting material, the thickness increase of the first ETL 14 for improving the emitting efficiency of the organic light emitting display device causes the increase of the driving voltage of the organic light emitting display device.

Figure 4:
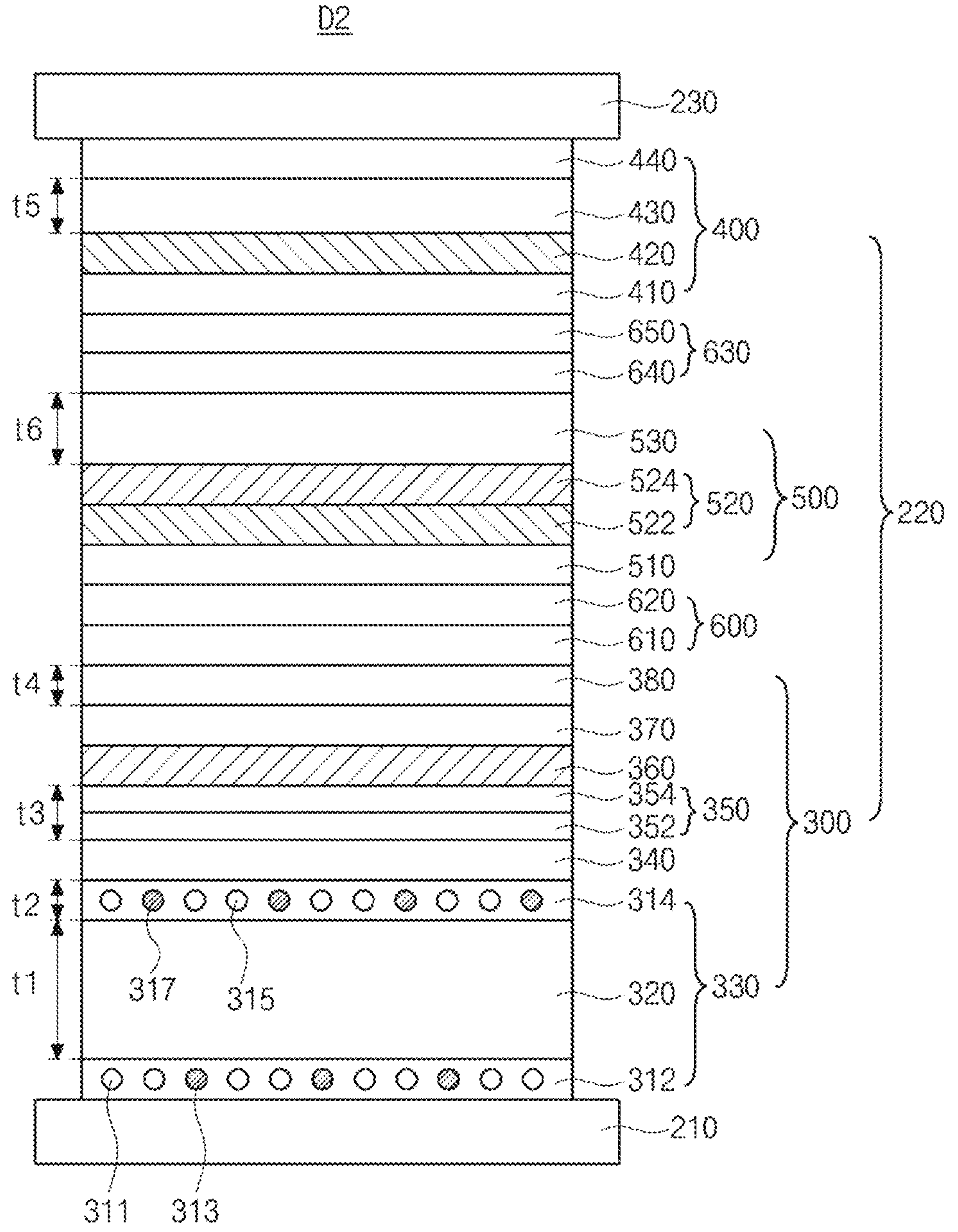
FIG. 4 is a schematic cross-sectional view of an OLED according to an embodiment of the present disclosure.

FIG. 4 is a schematic cross-sectional view of an OLED according to an embodiment of the present disclosure.

As shown in FIG. 4, the OLED D2 includes the cathode 210 connected to the driving TFT, the anode 230 facing the cathode 210 and an organic light emitting layer 220 between the cathode 210 and the anode 230, and the organic light emitting layer 220 includes a first emitting part 300 including a first EML 360, a p-doing layer 330, an n-doping layer 340 and a first ETL 350, a second emitting part 400 including a second EML 420 and a third emitting part 500 including a third EML 520.

In addition, the organic light emitting layer 220 can further include a first CGL 600 between the first and third emitting parts 300 and 500 and a second CGL 630 between the second and third emitting parts 400 and 500.

In the first emitting part 300, the p-doping layer 330 is positioned between the first EML 360 and the cathode 210, the n-doping layer 340 is positioned between the first EML 360 and the p-doping layer 330, and the first ETL 350 is positioned between the n-doping layer 340 and the first EML 360.

The first emitting part 300 can further include a first HTL 380 on the first EML 360. In addition, the first emitting part 300 can further include a first EBL 370 between the first EML 360 and the first HTL 380.

The second emitting part 400 can further include at least one of a second ETL 410 under the second EML 420, a second HTL 430 between the second EML 420 and the anode 230 and an HIL 440 between the second HTL 430 and the anode 230. In addition, the second emitting part 400 can further include a second EBL between the second EML 420 and the second HTL 430.

The third emitting part 500 can further include at least one of a third ETL 510 under the third EML 520 and a third HTL 530 on the third EML 520.

The first CGL 600 can include a first p-type CGL 610 and a first n-type CGL 620. The first p-type CGL 610 is positioned between the first emitting part 300 and the third emitting part 500, and the first n-type CGL 620 is positioned between the first p-type CGL 610 and the third emitting part 500.

The first p-type CGL 610 provides a hole into the first EML 360 of the first emitting part 300, and the first n-type CGL 620 provides an electron into the third EML 520 of the third emitting part 500.

The second CGL 630 can include a second p-type CGL 640 and a second n-type CGL 650. The second p-type CGL 640 is positioned between the third emitting part 500 and the second emitting part 400, and the second n-type CGL 650 is positioned between the second p-type CGL 640 and the second emitting part 400.

The second p-type CGL 640 provides a hole into the third EML 520 of the third emitting part 500, and the second n-type CGL 650 provides an electron into the second EML 420 of the second emitting part 400.

Each of the first and second EMLs 360 and 420 can be a blue EML. The first EML (e.g., a first blue EML) 360 includes a first blue host and a first blue dopant, and the second EML (e.g., a second blue EML) 420 includes a second blue host and a second blue dopant. The first and second blue hosts can be same or different, and the first and second blue dopants can be same or different.

Each of the first and second blue dopants can be a fluorescent material. Alternatively, each of the first and second blue dopants can be a phosphorescent material or a delayed fluorescent material.

For example, each of the first and second blue hosts can independently be one of mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl) biphenyl (Ph-mCP), TSPO1, 9-(3'-(9H-carbazol-9-yl)-[1,1'-biphenyl]-3-yl)-9H-pyrido[2,3-b]indole (CzBPCb), bis(2-methylphenyl)diphenylsilane (UGH-1), 1,4-bis (triphenylsilyl)benzene (UGH-2), 1,3-bis(triphenylsilyl) benzene (UGH-3), 9,9-spiorobifluoren-2-yl-diphenyl-phosphine oxide (SPPO1), and 9,9'-(5-(triphenylsilyl)-1,3-phenylene)bis(9H-carbazole) (SimCP).

Each of the first and second blue dopants can independently be one of perylene, 4,4'-bis[4-(di-p-tolylamino) styryl]biphenyl (DPAVBi), 4-(di-p-tolylamino)-4-4'-[(di-p-tolylamino)styryl]stilbene (DPAVB), 4,4'-bis[4-(diphenylamino)styryl]biphenyl (BDAVBi), 2,7-(bis(4-diphenylamino)styryl)-9,9-spiorfluorene (spiro-DPVBi), [1,4-bis[2-[4-[N,N-di(p-tolyl)amino]phenyl]vinyl] benzene (DSB), 1-4-di-[4-(N,N-diphenyl)amino]styryl-benzene (DSA), 2,5,8,11-tetra-tetr-butylperylene (TBPe), bis((2-hydroxylphenyl)-pyridine)beryllium (Bepp2), 9-(9-Phenylcarbazole-3-yl)-10-(naphthalene-1-yl)anthracene (PCAN), mer-tris(1-phenyl-3-methylimidazolin-2-ylidene-C,C(2)') iridium(III) (mer-Ir(pmi)3), fac-Tris(1,3-diphenyl-benzimidazolin-2-ylidene-C,C(2)')iridium(III) (fac-Ir(dpbic)3), bis (3,4,5-trifluoro-2-(2-pyridyl)phenyl-(2-carboxypyridyl)) iridium(III) (Ir(tfpd)2pic), tris(2-(4,6-difluorophenyl) pyridine)iridium(III) (Ir(Fppy)3), and bis[2-(4,6-difluorophenyl)pyridinato-C2,N](picolinato)iridium(III) (Firpic).

In an aspect of the present disclosure, each of the first and second blue hosts can independently be a compound represented by Formula 1-1, and each of the first and second blue dopants can independently be a compound represented by Formula 1-2.

[Formula 1-1]

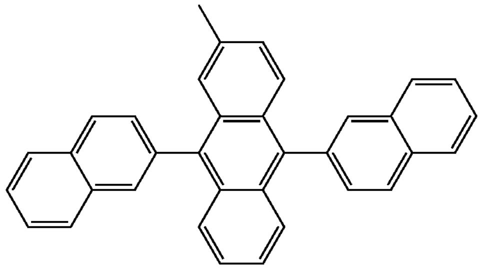

[Formula 1-2]

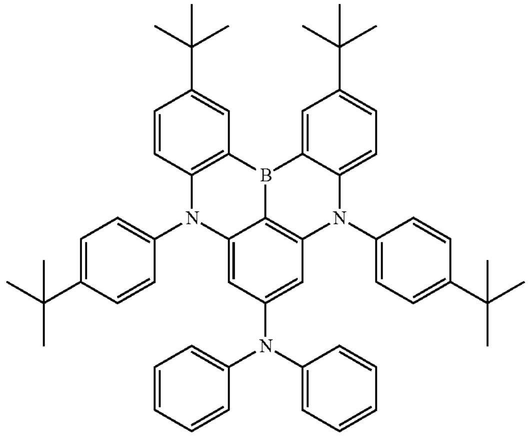

Each of a weight % of the first blue dopant in the first EML 360 and a weight % of the second blue dopant in the second EML 420 can be in a range of 1 to 5. The weight % of the first blue dopant in the first EML 360 and the weight % of the second blue dopant in the second EML 420 can be same or different.

Each of the first and second EMLs 360 and 420 can have a thickness of 200 to 350 Å. The thickness of the first EML 360 and the thickness of the second EML 420 can be same or different. In an aspect of the present disclosure, the thickness of the first EML 360 can be smaller than that of the second EML 420.

The third EML 520 includes the red and green EMLs 522 and 524. In an aspect of the present disclosure, a thickness of the red EML 522 can be smaller than that of the green EML 524.

In addition, the third EML 520 can further include a yellow-green EML between the red and green EMLs 522 and 524.

The red EML 522 can include a red host and a red dopant. For example, the red host can be a phosphorescent compound.

The red host can be selected from the group consisting of mCP-CN, CBP, mCBP, mCP, DPEPO, 2,8-bis(diphenylphosphoryl)dibenzothiophene (PPT), 1,3,5-tri[(3-pyridyl)-phen-3-yl]benzene (TmPyPB), 2,6-di(9H-carbazol-9-yl)pyridine (PYD-2Cz), 2,8-di(9H-carbazol-9-yl) dibenzothiophene (DCzDBT), 3',5'-di(carbazol-9-yl)-[1,1'-biphenyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, 9,9'-diphenyl-9H,9'H-3,3'-bicarbazole (BCzPh), 1,3,5-tris(carbazole-9-yl)benzene (TCP), TCTA, 4,4'-bis(carbazole-9-yl)-2,2'-dimethylbiphenyl (CDBP), 2,7-bis(carbazole-9-yl)-9,9-dimethylfluorene (DMFL-CBP), 2,2',7,7'-tetrakis (carbazole-9-yl)-9,9-spiorofluorene (Spiro-CBP), and 3,6-bis(carbazole-9-yl)-9-(2-ethyl-hexyl)-9H-carbazole (TCz1), but it is not limited thereto.

The red dopant can be selected from the group consisting of [bis(2-(4,6-dimethyl)phenylquinoline)](2,2,6,6-tetramethylheptane-3,5-dionate)iridium(III), bis[2-(4-n-hexylphenyl)quinoline](acetylacetonate)iridium(III) (Hex-Ir(phq)2 (acac)), tris[2-(4-n-hexylphenyl)quinoline]iridium(III) (Hex-Ir(phq)3), tris[2-phenyl-4-methylquinoline]iridium (III) (Ir(Mphq)3), bis(2-phenylquinoline)(2,2,6,6-tetramethylheptene-3,5-dionate)iridium(III) (Ir(dpm)PQ2), bis(phenylisoquinoline)(2,2,6,6-tetramethylheptene-3,5-dionate) iridium(III) (Ir(dpm)(piq)2), bis[(4-n-hexylphenyl) isoquinoline](acetylacetonate)iridium(III) (Hex-Ir(piq)2 (acac)), tris[2-(4-n-hexylphenyl)quinoline]iridium(III) (Hex-Ir(piq)3), tris(2-(3-methylphenyl)-7-methyl-quinolato)iridium (Ir(dmpq)3), bis[2-(2-methylphenyl)-7-methyl-quinoline](acetylacetonate)iridium(III) (Ir(dmpq)2(acac)), bis[2-(3,5-dimethylphenyl)-4-methyl-quinoline](acetylacetonate)iridium(III)(Ir(mphmq)2(acac)), and tris(dibenzoylmethane)mono(1,10-phenanthroline)europium(III) (Eu (dbm)3(phen)), but it is not limited thereto.

The green EML 524 can include a green host and a green dopant. For example, the green host can be a phosphorescent compound.

The green host can be selected from the group consisting of mCP-CN, CBP, mCBP, mCP, DPEPO, 2,8-bis(diphenylphosphoryl)dibenzothiophene (PPT), TmPyPB, PYD-2Cz, 2,8-di(9H-carbazol-9-yl)dibenzothiophene (DCzDBT), 3',5'-di(carbazol-9-yl)-[1,1'-biphenyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, and 9-(9-phenyl-9H-carbazol-6-yl)-9H-carbazole (CCP), but it is not limited thereto.

The green dopant can be selected from the group consisting of [bis(2-phenylpyridine)](pyridyl-2-benzofuro[2,3-b]pyridine)iridium, tris[2-phenylpyridine]iridium(III) (Ir (ppy)3), fac-tris(2-phenylpyridine)iridium(III) (fac-Ir(ppy) 3), bis(2-phenylpyridine)(acetylacetonate)iridium(III) (Ir (ppy)2(acac)), tris[2-(p-tolyl)pyridine]iridium(III) (Ir (mppy)3), bis(2-(naphthalene-2-yl)pyridine) (acetylacetonate)iridium(III) (Ir(npy)2acac), tris(2-phenyl-3-methyl-pyridine)iidium (Ir(3mppy)3), and fac-tris(2-(3-p-xylyl)phenyl)pyridine iridium(III) (TEG), but it is not limited thereto.

The yellow-green EML can include a yellow-green host and a yellow-green dopant. For example, the yellow-green host can be a phosphorescent compound.

The yellow-green host can be selected from the materials for the green host.

The yellow-green dopant can be selected from the group consisting of 5,6,11,12-tetraphenylnaphthalene (Rubrene), 2,8-di-tert-butyl-5,11-bis(4-tert-butylphenyl)-6,12-diphenyltetracene (TBRb), bis(2-phenylbenzothiazolato)(acetylacetonate)iridium(III) (Ir(BT)2(acac)), bis(2-(9,9-diethyl-fluoren-2-yl)-1-phenyl-1H-benzo[d]imdiazolato) (acetylacetonate)iridium(III) (Ir(fbi)2(acac)), bis(2-phenylpyridine)(3-(pyridine-2-yl)-2H-chromen-2-onate) iridium(III) (fac-Ir(ppy)2Pc), bis(2-(2,4-difluorophenyl) quinoline)(picolinate)iridium(III) (FPQIrpic), and bis(4-phenylthieno[3,2-c]pyridinato-N,C2') (acetylacetonate) iridium(III) (PO-01), but it is not limited thereto.

In the first emitting part 300, the p-doping layer 330 includes a hole transporting material layer 320, a first p-doping layer 312 and a second p-doping layer 314. The hole transporting material layer 320 is positioned between the first and second p-doping layers 312 and 314. Namely, the p-doping layer 330 has a triple-layered structure. The first p-doping layer 312 can contact the cathode 210, and the second p-doping layer 314 can contact the n-doping layer 340.

The hole transporting material layer 320 includes a hole transporting material. The hole transporting material in the hole transporting material layer 320 can have a hole mobility of $1*10^{-4}$ $Vcm^{-2}s^{-1}$ or more and an ionization energy of 5.6 eV or less.

In the present disclosure, the hole mobility can be measured by the Space Charge Limited Current (SCLC) and a value at square root of field (V/cm) being 500. The ionization energy can be measured by the AC3 surface analyzer.

The hole transporting material in the hole transporting material layer 320 can be an arylamine derivative (compound) having high hole mobility. For example, the hole transporting material in the hole transporting material layer 320 can include at least one selected from a first hole transporting material group consisting of N,N'-diphenyl-N,N'-bis(1-naphthyl)-1,1'-biphenyl-4,4"-diamine (NPB), N,N'-diphenyl-N,N'-bis(3-methylphenyl)-1,1'-biphenyl-4,4'-diamine (TPD), poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and N-([1,1'-biphenyl]-4-yl)-9,9-dimethyl-N-(4-(9-phenyl-9H-carbazol-3-yl)phenyl)-9H-fluoren-2-amine.

The hole transporting material layer 320 has a first thickness t1. For example, the first thickness t1 of the hole transporting material layer 320 can be in a range of 500 to 600 Å, e.g., preferably about 500 Å preferably about 520 Å, preferably about 540 Å, preferably about 560 Å, preferably about 580 Å or, preferably about 600 Å.

The first p-doping layer 312 includes a first host material 311 and a first p-type dopant 313, and the second p-doping layer 314 includes a second host material 315 and a second p-type dopant 317.

Each of the first and second host materials 311 and 315 can be independently selected from the first hole transporting material group and can be same or different. In an aspect of the present disclosure, each of the first and second host materials 311 and 315 can be same as or different from the hole transporting material in the hole transporting material layer 320.

Each of the first and second p-type dopants 313 and 317 can be an organic material having an electron affinity of 5.4 eV or more or a metal oxide having a work function value of 6.0 eV or more.

In the present disclosure, the electron affinity can be a value calculated by a difference between an ionization energy and an optical bandgap, and the optical bandgap can be an onset value in an absorption spectrum.

For example, each of the first and second p-type dopants 313 and 317 can be independently selected from the group consisting of a compound represented by Formula 2-1, a compound represented by Formula 2-2, a compound represented by Formula 2-3, $MoO_3$, $V_2O_5$ and $WO_3$. The first and second p-type dopants 313 and 317 can be same or different.

[Formula 2-1]

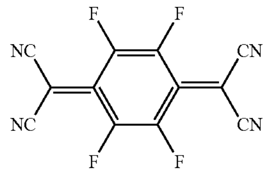

[Formula 2-2]

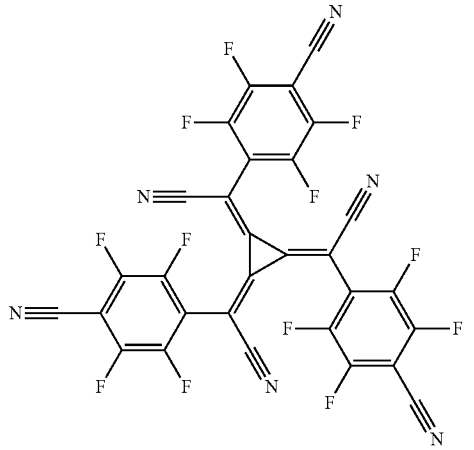

[Formula 2-3]

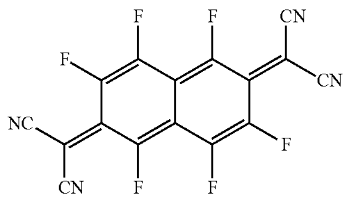

A weight % of the first p-type dopant 313 in the first p-doping layer 312 can be smaller than a weight % of the first host material 311 in the first p-doping layer 312, and a weight % of the second p-type dopant 317 in the second p-doping layer 314 can be smaller than a weight % of the second host material 315 in the second p-doping layer 314. For example, the first p-type dopant 313 in the first p-doping layer 312 can have a first weight % of 5 to 20, the second p-type dopant 317 in the second p-doping layer 314 can have a second weight % of 5 to 20. The first weight % and the second weight % can be same or different. In an aspect of the present disclosure, the first weight % of the first p-type dopant 313 can be smaller than the second weight % of the second p-type dopant 317.

Each of the first and second p-doping layers 312 and 314 can have a second thickness t2, and the second thickness t2 is smaller than the first thickness t1 of the hole transporting material layer 320. For example, the second thickness t2 can be in a range of 50 to 150 Å, e.g., preferably about 50 Å preferably about 75 Å, preferably about 100 Å, preferably about 120 Å, preferably about 140 Å, or preferably about 150 Å.

In the first emitting part 300, the n-doping layer 340 includes a host material and an n-type dopant. The host material of the n-doping layer 340 can be an organic material having an electron affinity of 2.6 eV or more. The host material is a phenanthroline derivative, and the n-type dopant is one of Li, Mg, Cs and Liq For example, the n-doping layer 340 can include a host material, such as 4,7-diphenyl-1,10-phenanthroline (Bphen), or 4,4',4"-tris(3-methylphenylamino)triphenylamine (MTDATA), and an n-type dopant being an alkali metal, such as Li, Na, K or Cs, or an alkali earth metal, such as Mg, Sr, Ba or Ra.

A weight % of the n-type dopant in the n-doping layer 340 can be smaller than each of the first weight % of the first p-type dopant 313 in the first p-doping layer 312 and the second weight % of the second p-type dopant 317 in the second p-doping layer 314. The weight % of the n-type dopant in the n-doping layer 340 can be in a range of 0.01 to 5.

In the first emitting part 300, the first ETL 350 is positioned between the first EML 360 and the n-doping layer 340. The first ETL 350 has a third thickness t3 being smaller than a thickness of the p-doping layer 330. The third thickness t3 of the first ETL 350 can be smaller than the first thickness t1 of the hole transporting material layer 320 and can be greater than the second thickness t2 of each of the first and second p-doping layers 312 and 314. For example, the third thickness t3 of the first ETL 350 can be in a range of 150 to 250 Å, e.g., preferably about 150 Å, preferably about 160 Å, preferably about 180 Å, preferably about 200 Å, preferably about 220 Å, or preferably about 250 Å.

For example, the first ETL 350 can include an electron transporting material being one of tris-(8-hydroxyquinoline aluminum) (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato) aluminum (Balq), 4,7-diphenyl-1,10-phenanthroline (Bphen), 2,9-bis(naphthalene-2-yl)4,7-diphenyl-1,10-phenanthroline (Nbphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3 '-(pyridin-3-yl) biphenyl-3-yl)1,3,5-triazine (TmPPPyTz), poly[9,9-bis(3'-((N,N-dimethyl)-N-ethylammonium)-propyl)-2,7-fluorene]-alt-2,7-(9,9-dioctylfluorene)]dibromide (PFNBr), tris(phenylquinoxaline) (TPQ), diphenyl-4-triphenylsilyl-phenylphosphine oxide (TSPO1), and 2-[4-(9,10-Di-2-naphthalen-2-yl-2-anthracen-2-yl)phenyl]-1-phenyl-1H-benzimidazole (ZADN).

In an aspect of the present disclosure, the first ETL 350 can include at least one of compounds in Formulas 3-1 and 3-2.

[Formula 3-1]

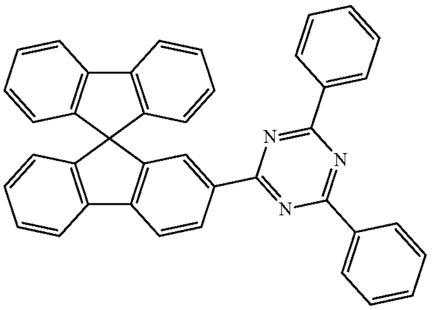

[Formula 3-2]

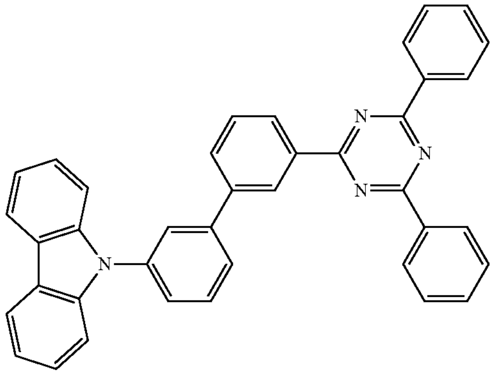

In an aspect of the present disclosure, the first ETL 350 can have a double-layered structure of a first layer 352 and a second layer 354. In this configuration, the first and second layers 352 and 354 can have the same thickness. For example, the first layer 352 can include the compound in Formula 3-1, and the second layer 354 can include the compound in Formula 3-2.

The first HTL 380 of the first emitting part 300 can include at least one selected from a second hole transporting material group consisting of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine] (Poly-TPD), poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and N-([1,1'-biphenyl]-4-yl)-9,9-dimethyl-N-(4-(9-phenyl-9H-carbazol-3-yl)phenyl)-9H-fluoren-2-amine.

The first HTL 380 can have a fourth thickness t4 being smaller than the first thickness t1 of the hole transporting material layer 320 and the second thickness t2 of each of the first and second p-doping layers 312 and 314.

The first EBL 370 can have a thickness of 50 to 150 Å. The first EBL 370 can include an electron blocking material being one of tris(4-carbazoyl-9-yl-phenyl)amine (TCTA), tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl) benzene (mCP), 3,3'-bis(N-carbazolyl)-1,1'-biphenyl (mCBP), copper phthalocyanine (CuPc), N,N'-bis[4-[bis(3-methylphenyl)amino]phenyl]-N,N'-diphenyl-[1,1'-biphenyl]-4,4'-diamine (DNTPD), 1,3,5-tris[4-(diphenylamino) phenyl]benzene (TDAPB), DCDPA, and 2,8-bis(9-phenyl-9H-carbazol-3-yl)dibenzo[b,d]thiophene. In an aspect of the present disclosure, the electron blocking material of the first EBL 370 can be a compound in Formula 4.

[Formula 4]

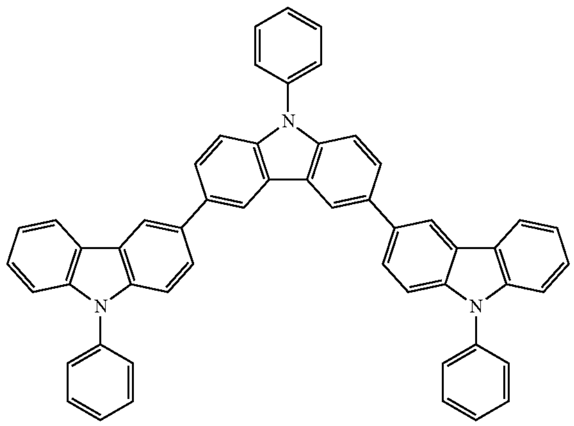

Figure 5:
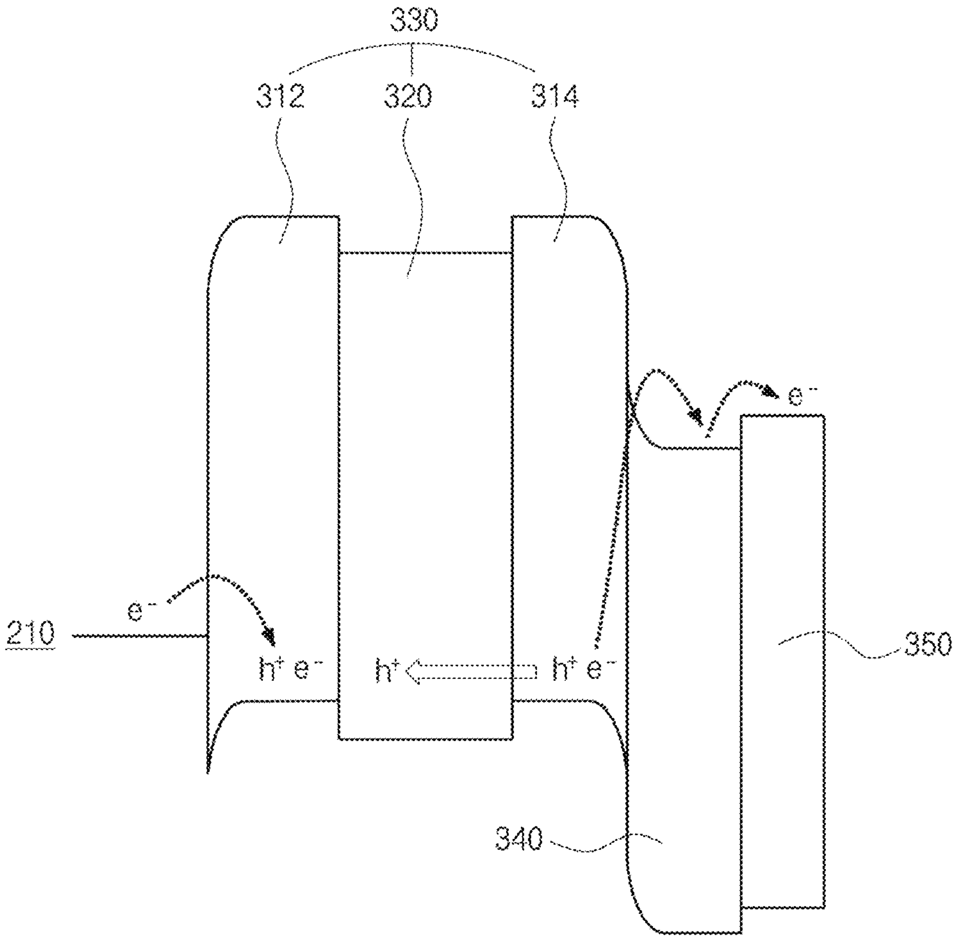
FIG. 5 is a schematic view illustrating an electron injection mechanism in the OLED in FIG. 4.

Referring to FIG. 5, which is a schematic view illustrating an electron injection mechanism in the OLED in FIG. 4, after a pair of an electron and a hole is generated and separated in the second p-doping layer 314, the electron and the hole respectively moves toward the n-doping layer 340 and the hole transporting material layer 320. In addition, after a pair of an electron and a hole is generated and separated in the first p-doping layer 312, the electron moves toward the hole transporting material layer 320 and combines with the hole from the second p-doping layer 314 and the hole combines with the electron from the cathode 210.

Consequently, the electron generated in the second p-doping layer 314 is injected into the first EML 360 through the n-doping layer 340 and the first ETL 350.

In the second emitting part 400, the second ETL 410 can include the above-mentioned electron transporting material. The second ETL 410 can have a thickness being greater than the third thickness t3 of the first ETL 350. For example, the thickness of the second ETL 410 can be in a range of 400 to 500 Å, e.g., preferably about 400 Å, preferably about 420 Å, preferably about 440 Å, preferably about 460 Å, preferably about 480 Å, or preferably about 500 Å.

In an aspect of the present disclosure, the second ETL 410 can have a double-layered structure of the third layer under the second EML 420 and a fourth layer between the second EML 420 and the third layer, and a thickness of the third layer can be greater than that of the fourth layer. For example, the third layer can include the compound in Formula 3-1, and the fourth layer can include the compound in Formula 3-2.

In the second emitting part 400, the second HTL 430 can include at least one compound selected from the second hole transporting material group. The second HTL 430 can have a fifth thickness t5 being smaller than the first thickness t1 of the hole transporting material layer 320 and greater than each of the second thickness t2 of each of the first and second p-doping layers 312 and 314 and the fourth thickness t4 of the first HTL 380. For example, the fifth thickness t5 of the second HTL 430 can be in a range of 250 to 300 Å, e.g., preferably about 250 Å, preferably about 260 Å, preferably about 270 Å, preferably about 280 Å, preferably about 290 Å, or preferably about 300 Å.

In the second emitting part 400, the HIL 440 can include a hole injection material and a p-type dopant. A weight % of the p-type dopant in the HIL 440 can be greater than each of a weight % of the first p-type dopant 313 in the first p-doping layer 312 and a weight % of the second p-type dopant 317 in the second p-doping layer 314. For example, the p-type dopant in the HIL 440 can have a weight % in a range of 25 to 35. The HIL 440 can have a thickness of 70 to 150 Å.

In the second emitting part 400, the second EBL can include the above-mentioned electron blocking material and can have a thickness of 50 to 150 Å. The thickness of the second EBL and the thickness of the first EBL 370 can be same or different.

In the third emitting part 500, the third ETL 510 can include the above-mentioned electron transporting material and can have a thickness being smaller than each of the first and second ETLs 350 and 410. For example, the third ETL 510 can have a thickness in a range of 70 to 150 Å.

In the third emitting part 500, the third HTL 530 can include at least one compound selected from the second hole transporting material group. The third HTL 530 can have a sixth thickness t6 being smaller than the first thickness t1 of the hole transporting material layer 320 and greater than each of the fourth thickness t4 of the first HTL 380 and the fifth thickness t5 of the second HTL 430. For example, the sixth thickness t6 of the third HTL 530 can be in a range of 400 to 500 Å.

Each of the first p-type CGL 610 and the second p-type CGL 640 can include a host material selected from the first hole transporting material group and a p-type dopant selected from the group consisting of the compound in Formula 2-1, the compound in Formula 2-2, the compound in Formula 2-3, $MoO_3$, $V_2O_5$ and $WO_3$. Each of a weight % of the p-type dopant in the first p-type CGL 610 and a weight % of the p-type dopant in the second p-type CGL 640 can be same as or greater than each of a weight % of the first p-type dopant in the first p-doping layer 312 and a weight % of the second p-type dopant in the second p-doping layer 314. In an aspect of the present disclosure, each of the weight % of the p-type dopant in the first p-type CGL 610 and the weight % of the p-type dopant in the second p-type CGL 640 can be greater than each of the weight % of the first p-type dopant 313 in the first p-doping layer 312 and the weight % of the second p-type dopant 317 in the second p-doping layer 314.

Each of the first n-type CGL 620 and the second n-type CGL 650 can include a host material and an n-type dopant. The host material of each of the first n-type CGL 620 and the second n-type CGL 650 can be an organic material having an electron affinity of 2.6 eV or more.

For example, each of the first n-type CGL 620 and the second n-type CGL 650 can include a host material, e.g., 4,7-diphenyl-1,10-phenanthroline (Bphen) or 4,4',4"-tris(3-methylphenylamino)triphenylamine (MTDATA), and an n-type dopant being an alkali metal, e.g., Li, Na, K or Cs, or an alkali earth metal, e.g., Mg, Sr, Ba or Ra.

In an aspect of the present disclosure, each of a weight % of the n-type dopant in the first n-type CGL 620 and a weight % of the n-type dopant in the second n-type CGL 650 can be same as a weight % of the n-type dopant in the n-doping layer 340.

As described above, the OLED D2 is an inverted-structure 3-stack white OLED.

In this configuration, the first emitting part 300, which is disposed to be closer to the cathode 210 and includes the first EML 360 being a blue EML, includes the p-doping layer including the hole transporting material layer 320 and the first and second p-doping layers 312 and 314 and being disposed between the cathode 210 and the n-doping layer 340, and the first ETL 350 has a relatively small thickness. According to an aspect of the invention, the first ETL 350 may have a thickness of 100 to 600 Å, for example, 150, 200, or 250 to 300, 350, 400, or 500 Å.

Accordingly, in the inverted-structure OLED D2, the cathode 210 and the first EML 360 has a pre-determined distance so that the emitting efficiency can be improved, and the increase of the thickness of the first ETL 350 is prevented so that the increase of the driving voltage in the OLED D2 can be minimized or prevented.

[OLED2]

A cathode (ITO), a first p-doping layer (100 Å), a hole transporting material layer (NPB, 550 Å), a second p-doping layer (100 Å), an n-doping layer (Bphen and Li (20 wt %), 100 Å), a first ETL (a first layer (the compound in Formula 3-1, 100 Å) and a second layer (the compound in Formula 3-2, 100 Å)), a first blue EML (the compound in Formula 1-1 and the compound in Formula 1-2 (2 wt %), 250 Å), an EBL, a first HTL, a first p-type CGL, a first n-type CGL, a third ETL, a red EML, a green EML, a third HTL, a second p-type CGL, a second n-type CGL, a second ETL, a second blue EML, a second HTL, an HIL, and an anode (A1) were sequentially stacked on a substrate to form an inverted-structure 3-stack white OLED.

(1) EXAMPLE 2

NPB and the compound in Formula 2-1 (10 wt %) were used to form each of the first and second p-doping layers.

(2) EXAMPLE 3

NPB and the compound in Formula 2-1 (10 wt %) were used to form the first p-doping layer, and NPB and the compound in Formula 2-1 (20 wt %) were used to form the second p-doping layer.

The emission properties, e.g., a driving voltage (V1 and V2), an efficiency (cd/A), an external quantum efficiency (EQE), a blue index (BI) and a color coordinate index (CIE(x, y)), of the OLED of Example 1 to 3 were measured and listed in Table 2. In Table 2, the driving voltage "V1" is a value measured at 10 mA/cm$^2$, and the driving voltage "V2" is a value measured at 100 mA/cm$^2$. The color coordinate index of Examples 2 and 3 is a relative value to the color coordinate index of Example 1.

TABLE 2

| | V1 | V2 | cd/A | EQE | BI | CIEx | CIEy |
|---|---|---|---|---|---|---|---|
| Ex1 | 100% | 100% | 100% | 100% | 100% | — | — |
| Ex2 | 100% | 93% | 94% | 97% | 97% | 0.002 | −0.002 |
| Ex3 | 100% | 94% | 94% | 96% | 96% | 0.002 | −0.001 |

As shown in Table 2 above, in comparison to the OLED of Example 1, in which the first ETL has a relatively large thickness, the driving voltage of the OLED of Examples 2 and 3, in which the first emitting part includes the first ETL having a relatively small thickness and the p-doping layer including the hole transporting material layer and the first and second p-doping layers, is reduced.

On the other hand, in comparison to the OLED of Example 1, the efficiency and the external quantum efficiency of the OLED of Examples 2 and 3 are slightly decreased. However, in the OLED of Examples 2 and 3, since the cathode and the first EML have a pre-determined distance, the OLED has sufficient efficiency. (See Table 2)

In comparison to the OLED of Example 2, in the OLED of Example 3, in which a weight % of p-type dopant in the p-doing layer is increased, the driving voltage can be increased, and the efficiency can be decreased.

Figure 6:
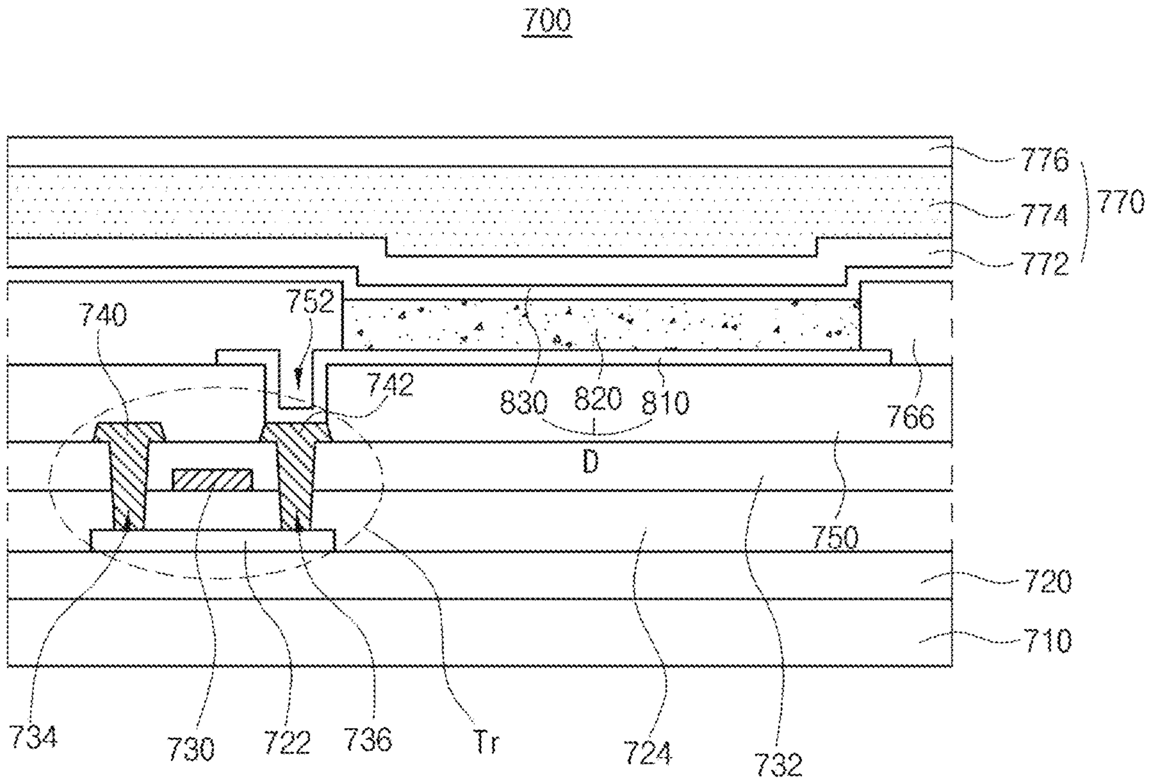
FIG. 6 is a schematic cross-sectional view of an organic light emitting display device according to an embodiment of the present disclosure.

FIG. 6 is a schematic cross-sectional view of an organic light emitting display device according to an embodiment of the present disclosure.

As shown in FIG. 6, the organic light emitting display device 700 includes a substrate 710, a thin film transistor (TFT) Tr over the substrate 710 and an OLED D over the TFT Tr and connected to the TFT Tr.

The substrate 710 can be a glass substrate or a flexible substrate.

A buffer layer 720 is formed on the substrate 710, and the TFT Tr corresponding to a red pixel region, a green pixel region and a blue pixel region is formed on the buffer layer 720. The buffer layer 720 can be omitted in certain embodiments, and the TFT Tr can be positioned on the substrate 710.

A semiconductor layer 722 is formed on the buffer layer 720. The semiconductor layer 722 can include an oxide semiconductor material. Alternatively, the semiconductor layer 722 includes polycrystalline silicon. In this case, impurities can be doped into both sides of the semiconductor layer 722 of polycrystalline silicon.

A gate insulating layer 724 of an insulating material is formed on the semiconductor layer 722. The gate insulating layer 724 can be formed of an inorganic insulating material such as silicon oxide or silicon nitride.

A gate electrode 730, which is formed of a conductive material, e.g., metal, is formed on the gate insulating layer 724 to correspond to a center of the semiconductor layer 722.

An interlayer insulating layer 732, which is formed of an insulating material, is formed on the gate electrode 730 over an entire surface of the substrate 710. The interlayer insulating layer 732 can be formed of an inorganic insulating material, e.g., silicon oxide or silicon nitride, or an organic insulating material, e.g., benzocyclobutene or photo-acryl.

The interlayer insulating layer 732 includes first and second semiconductor contact holes 734 and 736 exposing both sides of the semiconductor layer 722. The first and second semiconductor contact holes 734 and 736 are positioned at both sides of the gate electrode 730 to be spaced apart from the gate electrode 730.

A source electrode 740 and a drain electrode 742, which are formed of a conductive material, e.g., metal, are formed on the interlayer insulating layer 732. The source electrode 740 and the drain electrode 742 are spaced apart from each other with respect to the gate electrode 730 and respectively contact both sides of the semiconductor layer 722 through the first and second semiconductor contact holes 734 and 736.

The semiconductor layer 722, the gate electrode 730, the source electrode 740 and the drain electrode 742 constitute the TFT Tr, and the TFT Tr can be an n-type. The TFT Tr serves as a driving element. Namely, the TFT Tr can correspond to the driving TFT Td (of FIG. 1).

A planarization layer 750 is formed on the TFT Tr and over an entire surface of the substrate 710. The planarization layer 750 has a flat top surface and includes a drain contact hole 752 exposing the drain electrode 742 of the TFT Tr.

The OLED D is disposed on the planarization layer 750 and includes a cathode 810, which is connected to the drain electrode 742 of the TFT Tr, an organic light emitting layer 820 and an anode 830. The organic light emitting layer 820 and the anode 830 are sequentially stacked on the cathode 810. The OLED D is positioned in each of the red, green and blue pixel regions. The OLED D in the red pixel region emits red light, the OLED D in the green pixel region emits green light, and the OLED D in the blue pixel region emits blue light.

The cathode 810 is separately formed in each pixel region. The cathode 810 can be formed of a transparent conductive oxide (TCO). The cathode 810 can be a transparent electrode. For example, the cathode 810 can be formed of indium-tin-oxide (ITO), indium-zinc-oxide (IZO) or indium-tin-zinc-oxide (ITZO).

In addition, a bank layer 766 is formed on the planarization layer 750 to cover an edge of the cathode 810. Namely, the bank layer 766 is positioned at a boundary of the pixel region and exposes a center of the cathode 810 in the pixel region.

The organic light emitting layer 820 is formed on the cathode 810.

In the blue pixel region, the organic light emitting layer 820 includes a first emitting part positioned over the cathode 810 and including a first EML, a second emitting part including a second EML and positioned between the first emitting part and the anode 830 and a third emitting part including a third EML and positioned between the first and second emitting parts. The organic light emitting layer 820 can further include a first CGL between the first and third emitting parts and a second CGL between the second and third emitting parts.

Each of the first to third EMLs can be a blue EML.

The anode 830 is formed over the substrate 710 where the organic light emitting layer 820 is formed. The anode 830 covers an entire surface of the display area and can be formed of a metallic material having high reflectance. The anode 830 can be a reflective electrode. For example, the anode 830 can be formed of a material selected from the group consisting of aluminum (Al), magnesium (Mg), calcium (Ca), silver (Ag), their alloy, or their combination.

Namely, the OLED D in the blue pixel region can be an inverted-structure blue OLED.

An encapsulation layer (or an encapsulation film) 770 is formed on the anode 830 to prevent penetration of moisture into the OLED D. The encapsulation layer 770 includes a first inorganic insulating layer 772, an organic insulating layer 774 and a second inorganic insulating layer 776 sequentially stacked, but it is not limited thereto.

In addition, a metal plate can be further disposed on the encapsulation layer 770.

The organic light emitting display device 700 can further include a polarization plate for reducing an ambient light reflection. For example, the polarization plate can be a circular polarization plate.

As described above, the OLED D in the blue pixel region includes the first to third EMLs, each of which is a blue EML, and emits blue light. In addition, the OLED in the red pixel region includes at least one red EML and emits red light, and the OLED in the green pixel region includes at least one green EML and emits green light.

Figure 7:
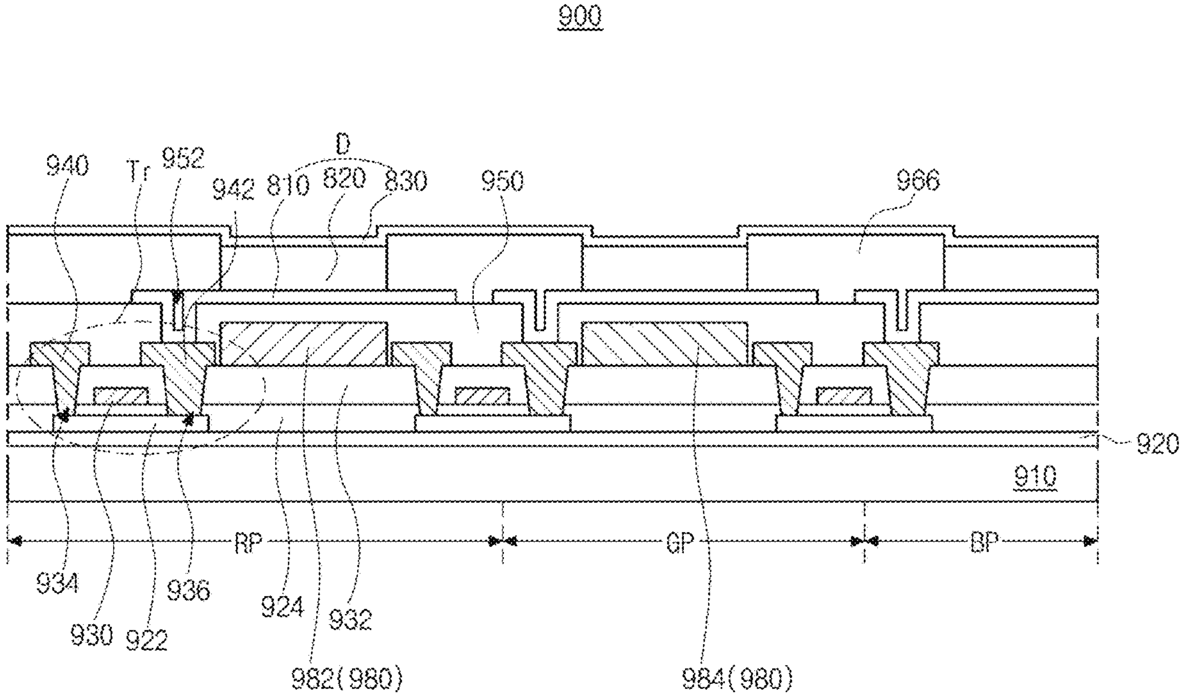
FIG. 7 is a schematic cross-sectional view of an organic light emitting display device according to an embodiment of the present disclosure.

FIG. 7 is a schematic cross-sectional view of an organic light emitting display device according to an embodiment of the present disclosure.

As shown in FIG. 7, the organic light emitting display device 900 includes a substrate 910, where a red pixel region RP, a green pixel region GP and a blue pixel region BP are defined, a TFT Tr over the first substrate 910, an OLED D, which is positioned over the TFT Tr and connected to the TFT Tr, and a color conversion layer 980 between the OLED D and the substrate 910.

The substrate 910 can be a glass substrate or a flexible substrate.

A buffer layer 920 is formed on the substrate 910, and the TFT Tr corresponding to each of the red, green and blue pixel regions RP, GP and BP is formed on the buffer layer 920. The buffer layer 920 can be omitted in certain embodiments, and the TFT Tr can be positioned on the substrate 910.

A semiconductor layer 922 is formed on the buffer layer 920. The semiconductor layer 922 can include an oxide semiconductor material. Alternatively, the semiconductor layer 922 includes polycrystalline silicon. In this case, impurities can be doped into both sides of the semiconductor layer 922 of polycrystalline silicon.

A gate insulating layer 924 of an insulating material is formed on the semiconductor layer 922. The gate insulating layer 924 can be formed of an inorganic insulating material such as silicon oxide or silicon nitride.

A gate electrode 930, which is formed of a conductive material, e.g., metal, is formed on the gate insulating layer 924 to correspond to a center of the semiconductor layer 922.

An interlayer insulating layer 932, which is formed of an insulating material, is formed on the gate electrode 930. The interlayer insulating layer 932 can be formed of an inorganic insulating material, e.g., silicon oxide or silicon nitride, or an organic insulating material, e.g., benzocyclobutene or photo-acryl.

The interlayer insulating layer 932 includes first and second contact holes 934 and 936 exposing both sides of the semiconductor layer 922. The first and second contact holes 934 and 936 are positioned at both sides of the gate electrode 930 to be spaced apart from the gate electrode 930.

A source electrode 940 and a drain electrode 942, which are formed of a conductive material, e.g., metal, are formed on the interlayer insulating layer 932. The source electrode 940 and the drain electrode 942 are spaced apart from each other with respect to the gate electrode 930 and respectively contact both sides of the semiconductor layer 922 through the first and second contact holes 934 and 936.

The semiconductor layer 922, the gate electrode 930, the source electrode 940 and the drain electrode 942 constitute the TFT Tr. The TFT Tr can be an n-type. The TFT Tr serves as a driving element. Namely, the TFT Tr can correspond to the driving TFT Td (of FIG. 1).

The color conversion layer 980 is formed on the interlayer insulating layer 932. The color conversion layer 980 includes red and green color conversion layers 982 and 984 respectively corresponding to the red and green pixel regions RP and GP. For example, the color conversion layer 980 can be formed of an inorganic emitting material such as a quantum dot.

A planarization layer 950 is formed on the color conversion layer 980 and the TFT Tr and over the substrate 910. The planarization layer 950 provides a flat top surface and includes a drain contact hole 952 exposing the drain electrode 942 of the TFT Tr.

The OLED D is disposed on the planarization layer 950 and includes a cathode 810, which is connected to the drain electrode 942 of the TFT Tr, an organic light emitting layer 820 and an anode 830. The light emitting layer 820 and the anode 830 are sequentially stacked on the cathode 810. The OLED D is positioned in each of the red, green and blue pixel regions RP, GP and BP and emits blue light.

The cathode 810 is separately formed in each of the red, green and blue pixel regions RP, GP and BP. The cathode 810 can be formed of a transparent conductive oxide (TCO). The cathode 810 can be a transparent electrode. For example, the cathode 810 can be formed of indium-tin-oxide (ITO), indium-zinc-oxide (IZO) or indium-tin-zinc-oxide (ITZO).

In addition, a bank layer 966 is formed on the planarization layer 950 to cover an edge of the cathode 810. Namely, the bank layer 966 is positioned at a boundary of the pixel region and exposes a center of the cathode 810 in the red, green and blue pixel regions RP, GP and BP. Since the OLED D is formed in each of the red, green and blue pixel regions RP, GP and BP and emits blue light, the organic light emitting layer 820 can be formed as a common layer without separation in the red, green and blue pixel regions RP, GP and BP. The bank layer 966 is formed to prevent a current leakage at an edge of the cathode 810 and can be omitted in certain embodiments.

The organic light emitting layer 820 is formed on the cathode 810.

The organic light emitting layer 820 includes a first emitting part positioned over the cathode 810 and including a first EML, a second emitting part including a second EML and positioned between the first emitting part and the anode 830 and a third emitting part including a third EML and positioned between the first and second emitting parts. The organic light emitting layer 820 can further include a first CGL between the first and third emitting parts and a second CGL between the second and third emitting parts.

Each of the first to third EMLs can be a blue EML.

The anode 830 is formed over the substrate 910 where the organic light emitting layer 820 is formed. The anode 830 covers an entire surface of the display area and can be formed of a metallic material having high reflectance. The anode 830 can be a reflective electrode. For example, the anode 830 can be formed of a material selected from the group consisting of aluminum (Al), magnesium (Mg), calcium (Ca), silver (Ag), their alloy, or their combination.

Namely, the OLED D in the red, green and blue pixel regions RP, GP and BP can be an inverted-structure blue OLED.

An encapsulation layer (or an encapsulation film) is formed on the anode 830 to prevent penetration of moisture into the OLED D. The encapsulation layer includes a first inorganic insulating layer, an organic insulating layer and a second inorganic insulating layer sequentially stacked, but it is not limited thereto.

In addition, a metal plate can be further disposed on the encapsulation layer.

The organic light emitting display device 900 can further include a polarization plate for reducing an ambient light reflection. For example, the polarization plate can be a circular polarization plate.

As described above, the OLED D in each of the red, green and blue pixel regions RP, GP and BP includes the first to third EMLs, each of which is a blue EML, and emits blue light. The blue light from the OLED D in the red pixel region RP can be converted into red light by the red color conversion layer 982, and the blue light from the OLED D in the green pixel region GP can be converted into green light by the green color conversion layer 984.

In FIG. 7, a color conversion layer is not presented in the blue pixel region BP. Alternatively, the color conversion layer 980 can further include a blue color conversion layer corresponding to the blue pixel region BP, and the blue light from the OLED D in the blue pixel region BP can be converted into blue light by the blue color conversion layer.

Accordingly, the organic light emitting display device 900 can provide a full-color image.

A color filter layer can be formed between the substrate 910 and the color conversion layer 980. The color filter layer can include a red color filter layer corresponding to the red pixel region RP and a green color filter layer corresponding to the green pixel region GP.

Figure 8:
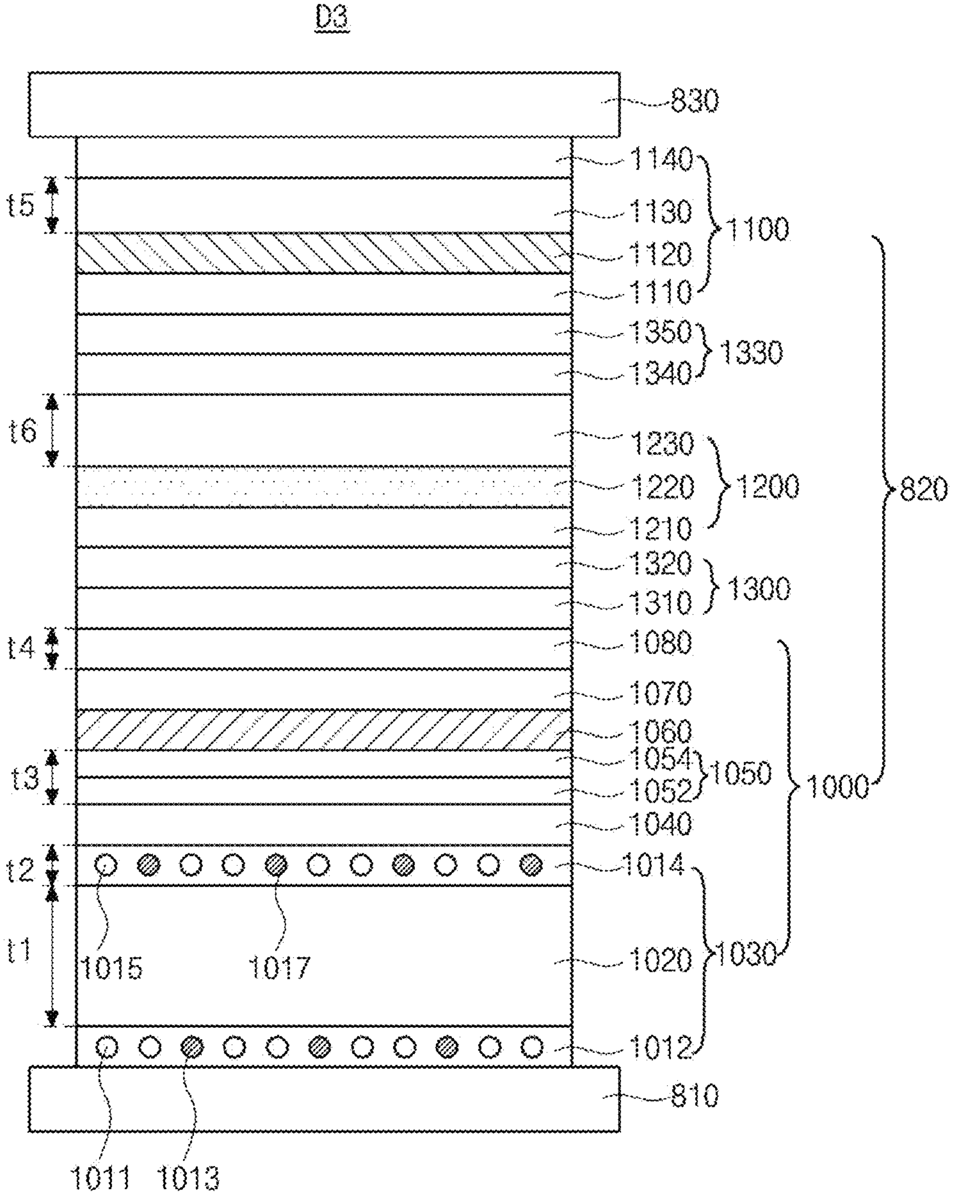
FIG. 8 is a schematic cross-sectional view of an organic light emitting display device according to an embodiment of the present disclosure.

FIG. 8 is a schematic cross-sectional view of an organic light emitting display device according to an embodiment of the present disclosure.

As shown in FIG. 8, the OLED D3 includes the cathode 810 connected to the driving TFT, the anode 830 facing the cathode 810 and an organic light emitting layer 820 between the cathode 810 and the anode 830, and the organic light emitting layer 820 includes a first emitting part 1000 including a first EML 1060, a p-doing layer 1030, an n-doping layer 1040 and a first ETL 1050, a second emitting part 1100 including a second EML 1120 and a third emitting part 1200 including a third EML 1220.

In addition, the organic light emitting layer 820 can further include a first CGL 1300 between the first and third emitting parts 1000 and 1200 and a second CGL 1330 between the second and third emitting parts 1100 and 1200.

In the first emitting part 1000, the p-doping layer 1030 is positioned between the first EML 1060 and the cathode 810, the n-doping layer 1040 is positioned between the first EML 1060 and the p-doping layer 1030, and the first ETL 1050 is positioned between the n-doping layer 1040 and the first EML 1060.

The first emitting part 1000 can further include a first HTL 1080 on the first EML 1060. In addition, the first emitting part 1000 can further include a first EBL 1070 between the first EML 1060 and the first HTL 1080.

The second emitting part 1100 can further include at least one of a second ETL 1110 under the second EML 1120, a second HTL 1130 between the second EML 1120 and the anode 830 and an HIL 1140 between the second HTL 1130 and the anode 830. In addition, the second emitting part 1100 can further include a second EBL between the second EML 1120 and the second HTL 1130.

The third emitting part 1200 can further include at least one of a third ETL 1210 under the third EML 1220 and a third HTL 1230 on the third EML 1220.

The first CGL 1300 can include a first p-type CGL 1310 and a first n-type CGL 1320. The first p-type CGL 1310 is positioned between the first emitting part 1000 and the third emitting part 1200, and the first n-type CGL 1320 is positioned between the first p-type CGL 1310 and the third emitting part 1200.

The first p-type CGL 1310 provides a hole into the first EML 1060 of the first emitting part 1000, and the first n-type CGL 1320 provides an electron into the third EML 1220 of the third emitting part 1200.

The second CGL 1330 can include a second p-type CGL 1340 and a second n-type CGL 1350. The second p-type CGL 1340 is positioned between the third emitting part 1200 and the second emitting part 1100, and the second n-type CGL 1350 is positioned between the second p-type CGL 1340 and the second emitting part 1100.

The second p-type CGL 1340 provides a hole into the third EML 1220 of the third emitting part 1200, and the second n-type CGL 1350 provides an electron into the second EML 1120 of the second emitting part 1100.

Each of the first to third EMLs 1060, 1120 and 1220 can be a blue EML. The first EML (e.g., a first blue EML) 1060 includes a first blue host and a first blue dopant, the second EML (e.g., a second blue EML) 1120 includes a second blue host and a second blue dopant, and the third EML (e.g., a third blue EML) 1220 includes a third blue host and a third blue dopant. The first, second and third blue hosts can be same or different, and the first, second and third blue dopants can be same or different.

Each of the first to third blue dopants can be a fluorescent material. Alternatively, each of the first to third blue dopants can be a phosphorescent material or a delayed fluorescent material.

For example, each of the first to third blue hosts can be independently selected from the above-mentioned blue host materials, and each of the first to third blue dopants can be independently selected from the above-mentioned blue dopant materials.

Each of a weight % of the first blue dopant in the first EML 1060, a weight % of the second blue dopant in the second EML 1120 and a weight % of the third blue dopant in the third EML 1220 can be in a range of 1 to 5. The weight % of the first blue dopant in the first EML 1060, the weight % of the second blue dopant in the second EML 1120 and the weight % of the third blue dopant in the third EML 1220 can be same or different.

Each of the first to third EMLs 1060, 1120 and 1220 can have a thickness of 200 to 350 Å. In an aspect of the present disclosure, the thickness of the first EML 1060 can be smaller than that of the second EML 1120.

In the first emitting part 1000, the p-doping layer 1030 includes a hole transporting material layer 1020, a first p-doping layer 1012 and a second p-doping layer 1014. The hole transporting material layer 1020 is positioned between the first and second p-doping layers 1012 and 1014. Namely, the p-doping layer 1030 has a triple-layered structure. The first p-doping layer 1012 can contact the cathode 810, and the second p-doping layer 1014 can contact the n-doping layer 1040.

The hole transporting material layer 1020 includes a hole transporting material. The hole transporting material in the hole transporting material layer 1020 can have a hole mobility of $1*10^{-4}$ $Vcm^{-2}s^{-1}$ or more and an ionization energy of 5.6 eV or less.

The hole transporting material in the hole transporting material layer 1020 can be an arylamine derivative having high hole mobility. For example, the hole transporting material in the hole transporting material layer 1020 can include at least one selected from the above-mentioned first hole transporting material group.

The hole transporting material layer 1020 has a first thickness t1. For example, the first thickness t1 of the hole transporting material layer 1020 can be in a range of 500 to 600 Å.

The first p-doping layer 1012 includes a first host material 1011 and a first p-type dopant 1013, and the second p-doping layer 1014 includes a second host material 1015 and a second p-type dopant 1017.

Each of the first and second host materials 1011 and 1015 can be independently selected from the first hole transporting material group and can be the same or different. In an aspect of the present disclosure, each of the first and second host materials 1011 and 1015 can be same as or different from the hole transporting material in the hole transporting material layer 1020.

Each of the first and second p-type dopants 1013 and 1017 can be an organic material having an electron affinity of 5.4 eV or more or a metal oxide having a work function value of 6.0 eV or more.

For example, each of the first and second p-type dopants 1013 and 1017 can be independently selected from the group consisting of a compound represented by Formula 2-1, a compound represented by Formula 2-2, a compound represented by Formula 2-3, $MoO_3$, $V_2O_5$ and $WO_3$. The first and second p-type dopants 1013 and 1017 can be same or different.

A weight % of the first p-type dopant 1013 in the first p-doping layer 1012 can be smaller than a weight % of the first host material 1011 in the first p-doping layer 1012, and a weight % of the second p-type dopant 1017 in the second p-doping layer 1014 can be smaller than a weight % of the second host material 1015 in the second p-doping layer 1014. For example, the first p-type dopant 1013 in the first p-doping layer 1012 can have a first weight % of 5 to 20, the second p-type dopant 1017 in the second p-doping layer 1014 can have a second weight % of 5 to 20. The first weight % and the second weight % can be same or different. In an aspect of the present disclosure, the first weight % of the first p-type dopant 1013 can be smaller than the second weight % of the second p-type dopant 1017.

Each of the first and second p-doping layers 1012 and 1014 can have a second thickness t2, and the second thickness t2 is smaller than the first thickness t1 of the hole transporting material layer 1020. For example, the second thickness t2 can be in a range of 50 to 150 Å.

In the first emitting part 1000, the n-doping layer 1040 includes a host material and an n-type dopant. The host material of the n-doping layer 1040 can be an organic material having an electron affinity of 2.6 eV or more.

For example, the n-doping layer 1040 can include a host material, such as Bphen, or MTDATA, and an n-type dopant being an alkali metal, such as Li, Na, K or Cs, or an alkali earth metal, such as Mg, Sr, Ba or Ra.

A weight % of the n-type dopant in the n-doping layer 1040 can be smaller than each of the first weight % of the first p-type dopant 1013 in the first p-doping layer 1012 and the second weight % of the second p-type dopant 1017 in the second p-doping layer 1014. The weight % of the n-type dopant in the n-doping layer 1040 can be in a range of 0.01 to 5.

In the first emitting part 1000, the first ETL 1050 is positioned between the first EML 1060 and the n-doping layer 1040. The first ETL 1050 has a third thickness t3 being smaller than a thickness of the p-doping layer 1030. The third thickness t3 of the first ETL 1050 can be smaller than the first thickness t1 of the hole transporting material layer 1020 and can be greater than the second thickness t2 of each of the first and second p-doping layers 1012 and 1014. For example, the third thickness t3 of the first ETL 1050 can be in a range of 150 to 250 Å.

For example, the first ETL 1050 can include the above-mentioned electron transporting material.

In an aspect of the present disclosure, the first ETL 1050 can have a double-layered structure of a first layer 1052 and a second layer 1054. In this configuration, the first and second layers 1052 and 1054 can have the same thickness. For example, the first layer 1052 can include the compound in Formula 3-1, and the second layer 1054 can include the compound in Formula 3-2.

The first HTL 1080 of the first emitting part 1000 can include at least one selected from the above-mentioned second hole transporting material group.

The first HTL 1080 can have a fourth thickness t4 being smaller than the first thickness t1 of the hole transporting material layer 1020 and the second thickness t2 of each of the first and second p-doping layers 1012 and 1014.

The first EBL 1070 can include above-mentioned electron blocking material and have a thickness of 50 to 150 Å.

In the second emitting part 1100, the second ETL 1110 can include the above-mentioned electron transporting material. The second ETL 1110 can have a thickness being greater than the third thickness t3 of the first ETL 1050. For example, the thickness of the second ETL 1110 can be in a range of 400 to 500 Å.

In an aspect of the present disclosure, the second ETL 1110 can have a double-layered structure of the third layer under the second EML 1120 and a fourth layer between the second EML 1120 and the third layer, and a thickness of the third layer can be greater than that of the fourth layer. For example, the third layer can include the compound in Formula 3-1, and the fourth layer can include the compound in Formula 3-2.

In the second emitting part 1100, the second HTL 1130 can include at least one compound selected from the second hole transporting material group. The second HTL 1130 can have a fifth thickness t5 being smaller than the first thickness t1 of the hole transporting material layer 1020 and greater than each of the second thickness t2 of each of the first and second p-doping layers 1012 and 1014 and the fourth thickness t4 of the first HTL 1080. For example, the fifth thickness t5 of the second HTL 1130 can be in a range of 250 to 300 Å, e.g., preferably about 250 Å, preferably about 260 Å, preferably about 270 Å, preferably about 280 Å, preferably about 290 Å, or preferably about 300 Å.

In the second emitting part 1100, the HIL 1140 can include a hole injection material and a p-type dopant. A weight % of the p-type dopant in the HIL 1140 can be greater than each of a weight % of the first p-type dopant 1013 in the first p-doping layer 1012 and a weight % of the second p-type dopant 1017 in the second p-doping layer 1014. For example, the p-type dopant in the HIL 1140 can have a weight % in a range of 25 to 35. The HIL 1140 can have a thickness of 70 to 150 Å, e.g., preferably about 70 Å, preferably about 80 Å, preferably about 100 Å, preferably about 120 Å, preferably about 140 Å, or preferably about 150 Å.

In the second emitting part 1100, the second EBL can include the above-mentioned electron blocking material and can have a thickness of 50 to 150 Å. The thickness of the second EBL and the thickness of the first EBL 1070 can be same or different.

In the third emitting part 1200, the third ETL 1210 can include the above-mentioned electron transporting material and can have a thickness being smaller than each of the first and second ETLs 1050 and 1110. For example, the third ETL 1210 can have a thickness in a range of 70 to 150 Å, e.g., preferably about 70 Å, preferably about 80 Å, preferably about 100 Å, preferably about 120 Å, preferably about 140 Å, or preferably about 150 Å.

In the third emitting part 1200, the third HTL 1230 can include at least one compound selected from the second hole transporting material group. The third HTL 1230 can have a sixth thickness t6 being smaller than the first thickness t1 of the hole transporting material layer 1020 and greater than each of the fourth thickness t4 of the first HTL 1080 and the fifth thickness t5 of the second HTL 1130. For example, the sixth thickness t6 of the third HTL 1230 can be in a range of 400 to 500 Å, e.g., preferably about 400 Å, preferably about 420 Å, preferably about 440 Å, preferably about 460 Å, preferably about 480 Å, or preferably about 500 Å.

Each of the first p-type CGL 1310 and the second p-type CGL 1340 can include a host material selected from the first hole transporting material group and a p-type dopant selected from the group consisting of the compound in Formula 2-1, the compound in Formula 2-2, the compound in Formula 2-3, $MoO_3$, $V_2O_5$ and $WO_3$. Each of a weight % of the p-type dopant in the first p-type CGL 1310 and a weight % of the p-type dopant in the second p-type CGL 1340 can be same as or greater than each of a weight % of the first p-type dopant in the first p-doping layer 1012 and a weight % of the second p-type dopant in the second p-doping layer 1014. In an aspect of the present disclosure, each of the weight % of the p-type dopant in the first p-type CGL 1310 and the weight % of the p-type dopant in the second p-type CGL 1340 can be greater than each of the weight % of the first p-type dopant 1013 in the first p-doping layer 1012 and the weight % of the second p-type dopant 1017 in the second p-doping layer 1014.

Each of the first n-type CGL 1320 and the second n-type CGL 1350 can include a host material and an n-type dopant. The host material of each of the first n-type CGL 1320 and the second n-type CGL 1350 can be an organic material having an electron affinity of 2.6 eV or more.

For example, each of the first n-type CGL 1320 and the second n-type CGL 1350 can include a host material, e.g., Bphen or MTDATA, and an n-type dopant being an alkali metal, e.g., Li, Na, K or Cs, or an alkali earth metal, e.g., Mg, Sr, Ba or Ra.

In an aspect of the present disclosure, each of a weight % of the n-type dopant in the first n-type CGL 1320 and a weight % of the n-type dopant in the second n-type CGL 1350 can be same as a weight % of the n-type dopant in the n-doping layer 1040.

As described above, the OLED D3 is an inverted-structure 3-stack blue OLED. The OLED D3 can be disposed in the blue pixel region of the organic light emitting display device in FIG. 6 or in each of the red, green and blue pixel regions of the organic light emitting display device in FIG. 7.

In FIG. 8, the OLED D3 includes the first to third EMLs each being a blue EML. Alternatively, the OLED D3 can further include additional emitting part including a blue EML to have 4 or more stack structure.

In this configuration, the first emitting part 1000, which is disposed to be closer to the cathode 810 and includes the first EML 1060 being a blue EML, includes the p-doping layer including the hole transporting material layer 1020 and the first and second p-doping layers 1012 and 1014 and being disposed between the cathode 810 and the n-doping layer 1040, and the first ETL 1050 has a relatively small thickness.

Accordingly, in the inverted-structure OLED D3, the cathode 810 and the first EML 1060 has a pre-determined distance so that the emitting efficiency can be improved, and the increase of the thickness of the first ETL 1050 is prevented so that the increase of the driving voltage in the OLED D3 can be minimized or prevented.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An organic light emitting device, comprising:

a substrate; and an organic light emitting diode over the substrate, the organic light emitting diode comprising:

a cathode over the substrate;

an anode over the cathode; and an organic light emitting layer positioned between the cathode and the anode, and comprising a first emitting part, a second emitting part between the first emitting part and the anode and a third emitting part between the first and second emitting parts, wherein the first emitting part comprises a first emitting material layer, a p-doping layer between the cathode and the first emitting material layer, an n-doping layer between the first emitting material layer and the p-doping layer, and a first electron transporting layer between the first emitting material layer and the n-doping layer, wherein the second emitting part comprises a second emitting material layer, and the third emitting part comprises a third emitting material layer, and wherein the p-doping layer comprises a hole transporting material layer, and a first p-doping layer and a second p-doping layer positioned at sides of the hole transporting material layer, respectively.

2. The organic light emitting device according to claim 1, wherein the hole transporting material layer comprises a hole transporting material, and wherein the first p-doping layer comprises a first host material and a first p-type dopant, and the second p-doping layer comprises a second host material and a second p-type dopant.

3. The organic light emitting device according to claim 2, wherein the hole transporting material has a hole mobility of about $1*10^{-4}$ $Vcm^{-2}s^{-1}$ or more and an ionization energy of about 5.6 eV or less.

4. The organic light emitting device according to claim 2, wherein the hole transporting material comprises an arylamine derivative.

5. The organic light emitting device according to claim 2, wherein each of the first and second host materials has an ionization energy of about 5.6 eV or less.

6. The organic light emitting device according to claim 2, wherein each of the first and second host materials is same as the hole transporting material.

7. The organic light emitting device according to claim 2, wherein each of the first and second p-type dopants has an electron affinity of about 5.4 eV or more.

8. The organic light emitting device according to claim 2, wherein each of the first and second p-type dopants is independently selected from a compound in Formula 2-1, a compound in Formula 2-2, a compound in Formula 2-3, $MoO_3$, $V_2O_5$ or $WO_3$:

[Formula 2-1]

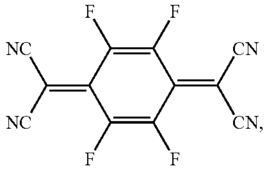

-continued

[Formula 2-2]

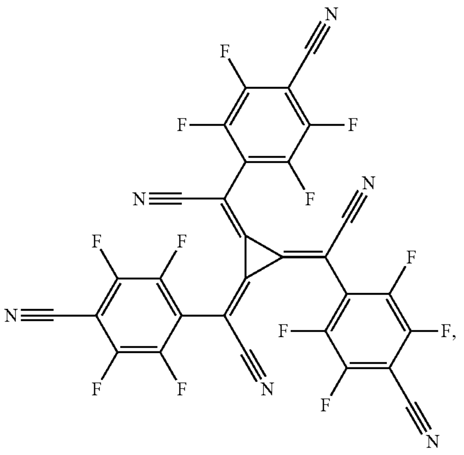

and

[Formula 2-3]

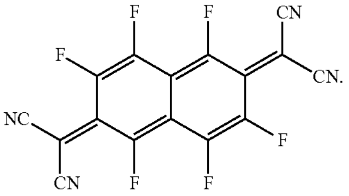

9. The organic light emitting device according to claim 2, wherein the organic light emitting diode further comprises:

a first charge generation layer comprising a first p-type charge generation layer and a first n-type charge generation layer, and positioned between the first and third emitting parts; and a second charge generation layer comprising a second p-type charge generation layer and a second n-type charge generation layer, and positioned between the second and third emitting parts.

10. The organic light emitting device according to claim 9, wherein the first p-type charge generation layer comprises a third host material and a third p-type dopant, and the second p-type charge generation layer comprises a fourth host material and a fourth p-type dopant, and wherein each of a weight % of the third p-type dopant in the first p-type charge generation layer and a weight % of the fourth p-type dopant in the second p-type charge generation layer is equal to or greater than each of a weight % of the first p-type dopant in the first p-doping layer and a weight % of the second p-type dopant in the second p-doping layer.

11. The organic light emitting device according to claim 1, wherein the hole transporting material layer has a first thickness, and each of the first and second p-doping layers has a second thickness, and wherein the first electron transporting layer has a third thickness being smaller than the first thickness and greater than the second thickness.

12. The organic light emitting device according to claim 1, wherein the n-doping layer comprises a host material and an n-type dopant, and wherein the host material is a phenanthroline derivative, and the n-type dopant is one of Li, Mg, Cs and Liq.

13. The organic light emitting device according to claim 1, wherein the first emitting part further comprises a first hole transporting layer between the first emitting material layer and the third emitting part, wherein the second emitting part further comprises a second hole transporting layer between the second emitting material layer and the anode, wherein the third emitting part further comprises a third hole transporting layer between the third emitting part and the second emitting part, and wherein each of a thickness of the first hole transporting material layer, a thickness of the second hole transporting material layer and a thickness of the third hole transporting material layer is smaller than a thickness of the hole transporting material layer.

14. The organic light emitting device according to claim 1, wherein the first electron transporting layer comprises at least one of a compound in Formula 3-1 and a compound in Formula 3-2:

[Formula 3-1]

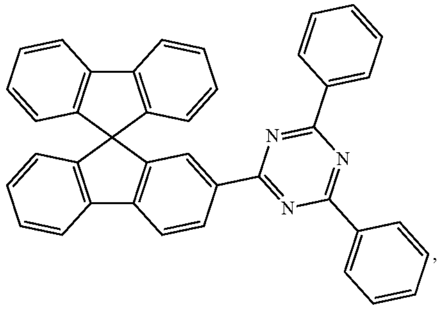

, and

[Formula 3-2]

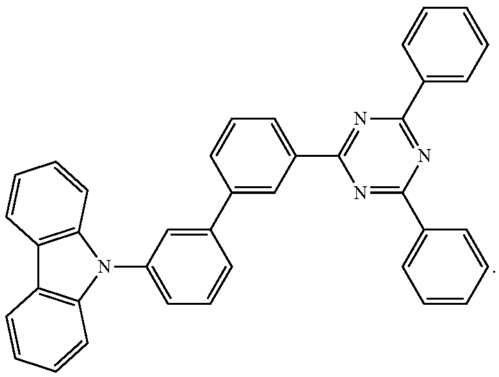

.

15. The organic light emitting device according to claim 1, wherein the first electron transporting layer comprises a first layer and a second layer between the first emitting material layer and the first layer, and wherein the first layer comprises a compound in Formula 3-1, and the second layer comprises a compound in Formula 3-2:

[Formula 3-1]

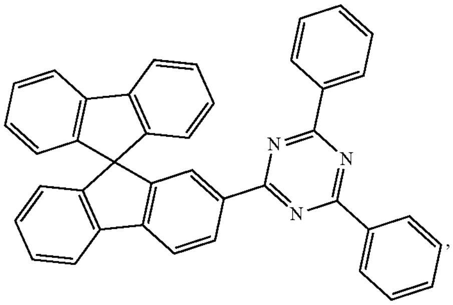

, and

[Formula 3-2]

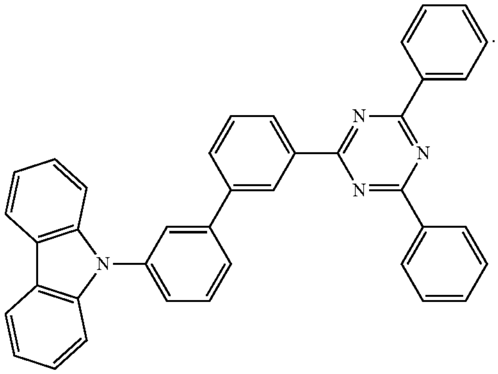

.

16. The organic light emitting device according to claim 1, wherein each of the first and second emitting material layers is a blue emitting material layer; optionally, wherein the third emitting material layer is a blue emitting material layer; and optionally, further comprising a color conversion layer between the substrate and the cathode.

17. The organic light emitting device according to claim 1, wherein the anode comprises a reflective material comprising aluminum (Al), magnesium (Mg), calcium (Ca), silver (Ag), an alloy thereof, or mixtures thereof.

18. The organic light emitting device according to claim 1, wherein the organic light emitting device has an inverted-structure where the organic light emitting layer is formed directly on the cathode and the anode is formed directly on the organic light emitting layer.

19. The organic light emitting device according to claim 16, wherein the third emitting material layer comprises a red emitting material layer and a green emitting material layer, and optionally, further comprising a color filter layer between the substrate and the cathode.

20. The organic light emitting device according to claim 1, wherein the organic light emitting diode is disposed in each of a plurality of pixel regions.

* * * * *